(12) United States Patent
Chiba et al.

(10) Patent No.: US 10,151,028 B2
(45) Date of Patent: Dec. 11, 2018

(54) FILM DEPOSITION APPARATUS

(71) Applicant: Tokyo Electron Limited, Tokyo (JP)

(72) Inventors: Takashi Chiba, Iwate (JP); Takahito Umehara, Iwate (JP); Masayuki Hasegawa, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 14/721,046

(22) Filed: May 26, 2015

(65) Prior Publication Data

US 2015/0345015 A1    Dec. 3, 2015

(30) Foreign Application Priority Data

May 30, 2014 (JP) .................... 2014-113029

(51) Int. Cl.
| | |
|---|---|
| *C23C 16/44* | (2006.01) |
| *C23C 16/458* | (2006.01) |
| *C23C 16/455* | (2006.01) |
| *C23C 16/505* | (2006.01) |
| *H01L 21/687* | (2006.01) |
| *C23C 14/50* | (2006.01) |
| *H01L 21/02* | (2006.01) |

(52) U.S. Cl.
CPC ...... *C23C 16/4412* (2013.01); *C23C 16/4584* (2013.01); *C23C 16/45548* (2013.01); *C23C 14/50* (2013.01); *C23C 16/458* (2013.01); *C23C 16/4583* (2013.01); *C23C 16/505* (2013.01); *H01L 21/02274* (2013.01); *H01L 21/68764* (2013.01); *H01L 21/68771* (2013.01)

(58) Field of Classification Search
None
See application file for complete search history.

(56) References Cited

U.S. PATENT DOCUMENTS

| | | | |
|---|---|---|---|
| 7,198,677 B2* | 4/2007 | Yoo ..................... | C23C 16/0236 118/715 |
| 7,488,400 B2* | 2/2009 | Koyata ............. | H01L 21/67075 134/153 |
| 2008/0032040 A1 | 2/2008 | Okabe et al. | |
| 2010/0227059 A1* | 9/2010 | Kato ................. | C23C 16/45551 427/255.28 |
| 2013/0042813 A1* | 2/2013 | Kato ................. | C23C 16/45578 118/730 |

(Continued)

FOREIGN PATENT DOCUMENTS

| | | |
|---|---|---|
| JP | 2013-222948 | 10/2013 |
| WO | 2005/093136 | 10/2005 |

*Primary Examiner* — Sylvia MacArthur
(74) *Attorney, Agent, or Firm* — IPUSA, PLLC

(57) ABSTRACT

A film deposition apparatus includes a vacuum chamber and a turntable provided in the vacuum chamber. A concave portion is formed in a surface of the turntable to accommodate a substrate therein, and a pedestal portion is provided to support a location inside a periphery of the substrate in the concave portion. At least one communication passage is formed in a wall portion of the concave portion to cause a first space around the pedestal portion in the concave portion to be in communication with a second space outside the turntable provided in an end area of the concave portion located opposite to a first center of the turntable when seen from a second center of the concave portion. An exhaust opening is provided to evacuate the vacuum chamber.

10 Claims, 19 Drawing Sheets

(56) References Cited

U.S. PATENT DOCUMENTS

| | | | | |
|---|---|---|---|---|
| 2013/0130187 A1* | 5/2013 | Moroi | ............... | F27D 21/00 432/32 |
| 2013/0156948 A1* | 6/2013 | Amano | ............ | H01L 21/67051 427/240 |
| 2013/0171831 A1* | 7/2013 | Namba | ............ | H01L 21/02087 438/748 |
| 2015/0345015 A1* | 12/2015 | Chiba | ................ | C23C 16/4412 118/730 |

* cited by examiner

ROTATIONAL DIRECTION OF TURNTABLE

FILM DEPOSITION APPARATUS

CROSS-REFERENCE TO RELATED APPLICATIONS

This patent application is based upon and claims the benefit of priority of Japanese Patent Application No. 2014-113029, filed on May 30, 2014, the entire contents of which are incorporated herein by reference.

BACKGROUND OF THE INVENTION

1. Field of the Invention

The present invention relates to a film deposition apparatus for depositing a film on a substrate by causing the substrate on a turntable to alternately pass through a source gas supply area for supplying a source gas and a reaction gas supply area for supplying a reaction gas reactable with the source gas by rotating the turntable in a vacuum chamber.

2. Description of the Related Art

So-called ALD (Atomic Layer Deposition) is known as a method for depositing a thin film such as a silicon oxide ($SiO_2$) film on a substrate such as a semiconductor wafer (which is hereinafter called a "wafer"). Japanese Laid-Open Patent Application Publication No. 2013-222948 discloses an apparatus for implementing ALD that includes a vacuum chamber and a turntable for receiving a plurality of wafers thereon provided in the vacuum chamber and causes the plurality of wafers arranged on the turntable to alternately pass through an area to which a source gas is supplied and an area to which a reaction gas reactable with the source gas is supplied. In a top surface of the turntable, a plurality of concave portions is formed to hold the wafers therein when the wafers are fitted therein. Each of the concave portions is formed to have a diameter slightly larger than a diameter of the wafer when seen in a planar view to provide a clearance outside the outer edge of the wafer (to hold the wafer detacheably therefrom).

It is known that the wafer warps at its central part so as to rise as compared to its peripheral part immediately after being transferred into the concave portion due to nonuniformity of a temperature of the wafer and then gradually reduces its warp as the uniformity of the temperature of the wafer increases. In the meantime, because the turntable is rotated, the wafer moves toward the peripheral side of the turntable by the clearance due to a centrifugal force caused by the rotation of the turntable. In this manner, because the wafer moves while returning to a flat state from a warped state, the wafer moves while rubbing the bottom surface of the concave portion with its peripheral part, which is liable to cause particles.

To prevent this, Japanese Laid-Open Patent Application Publication No. 2013-222948 proposes a configuration of providing a pedestal to support a wafer having a planar shape smaller than that of the wafer on the bottom surface of the concave portion. According to the configuration, because the peripheral part of the wafer is prevented from rubbing the bottom surface of the concave portion, the generation of the particles can be prevented. However, the inventors of the present invention have found that when performing a process of rotating the turntable at a high rotational speed or setting a processing atmosphere at a high pressure, a phenomenon occurs that the film thickness becomes locally thick at a part of the periphery. This phenomenon is considered to occur because when the wafer moves to the peripheral side of the turntable by the centrifugal force, the outer edge of the wafer is pressed against the inner wall of the concave portion and an upper end of a groove portion formed between the side wall of the pedestal and the inner wall of the concave portion is partially enclosed by the wafer, in which a gas is enclosed.

SUMMARY OF THE INVENTION

Embodiments of the present invention provide a film deposition apparatus solving one or more of the problems discussed above.

More specifically, the embodiments of the present invention may provide a film deposition apparatus that can ensure preferable uniformity of a film thickness across a substrate when depositing a film on the substrate placed on a turntable by rotating the turntable in a vacuum chamber.

According to one embodiment of the present invention, there is provided a film deposition apparatus that includes a vacuum chamber and a turntable provided in the vacuum chamber. A concave portion is formed in a surface of the turntable to accommodate a substrate therein, and a pedestal portion is provided to support a location inside a periphery of the substrate in the concave portion. At least one communication passage is formed in a wall portion of the concave portion to cause a first space around the pedestal portion in the concave portion to be in communication with a second space outside the turntable provided in an end area of the concave portion located opposite to a first center of the turntable when seen from a second center of the concave portion. An exhaust opening is provided to evacuate the vacuum chamber.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Figure 1:
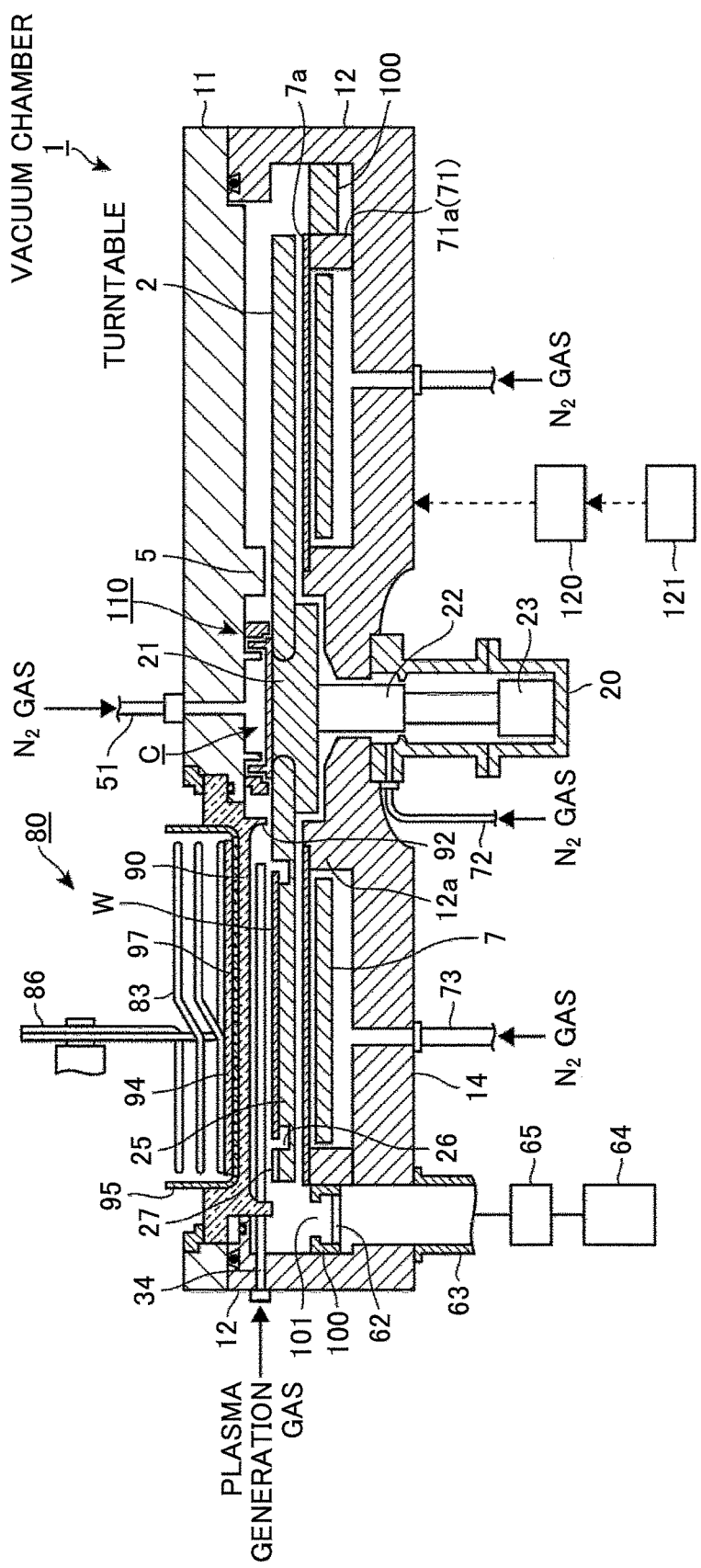
FIG. 1 is a vertical cross-sectional view illustrating an example of a film deposition apparatus according to an embodiment of the present invention.

A description is given below of embodiments of the present invention, with reference to accompanying drawings.

First Embodiment

A description is given below of a film deposition apparatus according to a first embodiment of the present invention. As illustrated in FIGS. 1 through 4, the film deposition apparatus includes a flattened vacuum chamber 1 having an approximately round planar shape, and a turntable 2 provided in the vacuum chamber 1 and having its rotational center coincided with the center of the vacuum chamber 1. The turntable 2 is, for example, made of quartz. The film deposition apparatus is configured to perform a film deposition process on a wafer W.

The vacuum chamber 1 includes a ceiling plate 11 and a chamber body 12. The ceiling plate 11 is configured to be attachable to or detachable from the chamber body 12. A separation gas supply pipe 51 is connected to a central part of the upper surface of the ceiling plate 11 to supply nitrogen ($N_2$) gas as a separation gas in order to prevent different process gases from mixing with each other in a central area C within the vacuum chamber 1.

As illustrated in FIG. 1, a heater unit 7 that is a heating mechanism is provided above a bottom part 14 of the vacuum chamber 1, and is configured to heat a wafer W on the turntable 2 up to a film deposition temperature, for example, 620 degree C. through the turntable 2. As illustrated in FIG. 1, a side cover member 71a is provided on the lateral side of the heater unit 7, and a top cover member 7a for covering the upper side of the heater unit 7 is provided. Purge gas supply pipes 73 for purging a space including the heater unit 7 from the lower end of the heater unit 7 are provided in the bottom part 14 at a plurality of locations along a circumferential direction of the vacuum chamber 1.

The turntable 2 is fixed to a core portion 21 having an approximately cylindrical shape at the central part, and is configured to be rotatable in a clockwise fashion about a rotational shaft 22 connected to a lower surface of the core portion 21 and extending in a vertical direction, which forms a vertical axis. As illustrated in FIG. 1, a drive unit (i.e., drive mechanism) 23 is provided to rotate the rotational shaft 22 about the vertical axis. Moreover, a case body 20 is provided to house the rotational shaft 22 and the drive unit 23. A purge gas supply pipe 72 is connected to the case body 20 to supply nitrogen gas to an area below the turntable 2 as a purge gas. A peripheral side of the core portion 21 in a bottom part 14 of the vacuum chamber 1 forms a protruding part 12a by being formed into a ring-like shape so as to come to close to the lower surface of the turntable 2.

Figure 2:
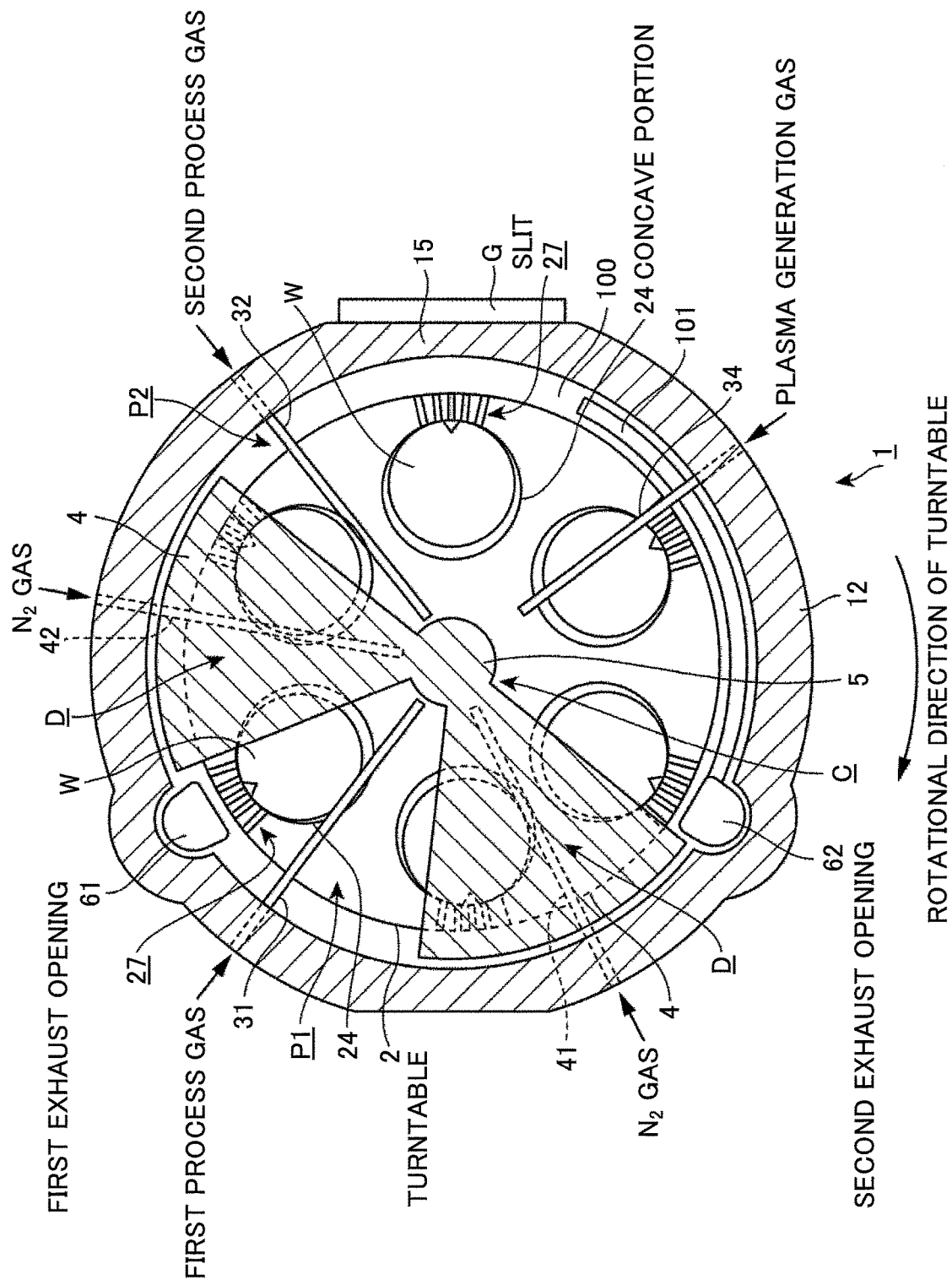
FIG. 2 is a horizontal cross-sectional plan view of a film deposition apparatus according to an embodiment of the present invention.
Figure 3:
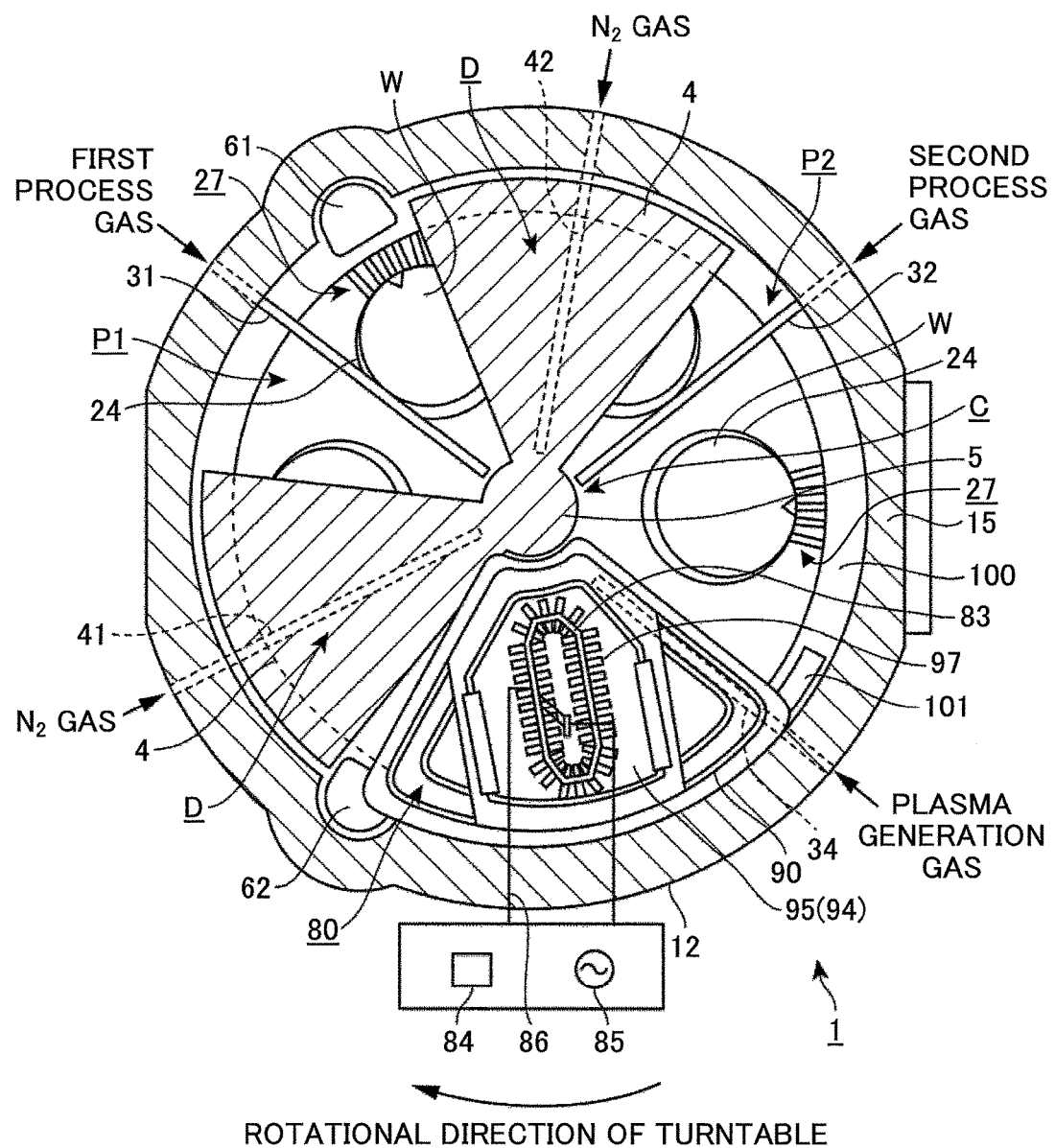
FIG. 3 is a horizontal cross-sectional plan view of a film deposition apparatus according to an embodiment of the present invention.
Figure 4:
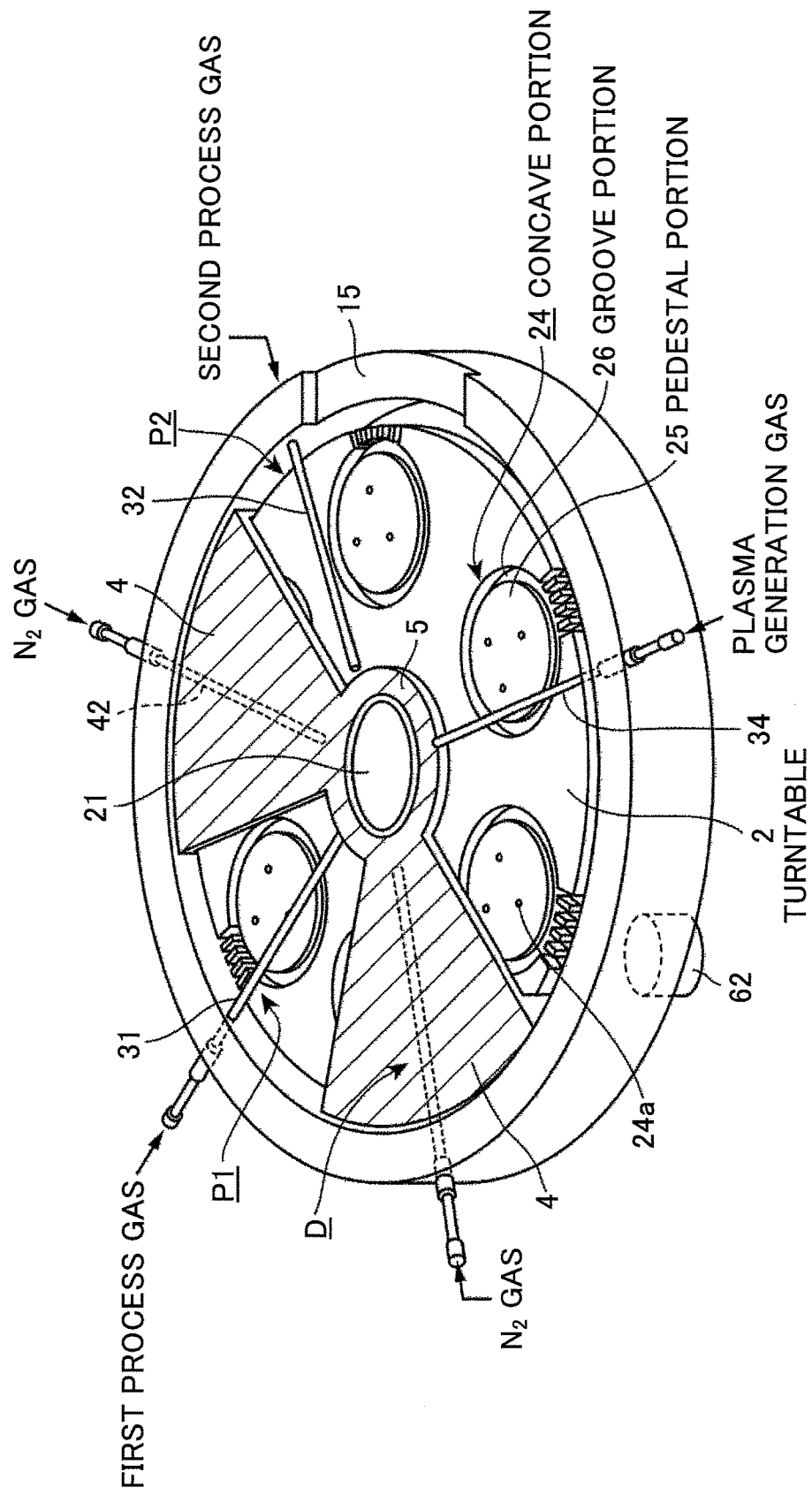
FIG. 4 is a perspective view illustrating a part of an inside of a film deposition apparatus according to an embodiment of the present invention.

As illustrated FIGS. 2 through 5, a plurality of, for example, six circular concave portions 24 are formed in a surface on one side (in an upper surface) of the turntable 2 along a rotational direction (circumferential direction) thereof to hold wafers made of a disk-shaped (circular) silicon plate fitted thereinto. Each of the concave portions 24 is formed to have an inner diameter slightly larger than the diameter of the wafer W when seen in a planar view to provide a gap area (clearance) between its inner surface and outer edge of the wafer W. More specifically, as illustrated in FIG. 6, a diameter dimension r of the wafer W and a diameter dimension R of the concave portion 24 are, for example, 300 mm and 302 mm, respectively. A diameter dimension of the turntable 2 is, for example, about 1000 mm. As illustrated in FIG. 4, through holes 24a are provided in each of the concave portions 24 to allow, for example, three lift pins (not illustrated in the drawings) to penetrate therethrough in order to move up and down the wafer W by lifting the wafer from below. A depiction of the through holes 24a is omitted other than in FIG. 4.

Figure 5:
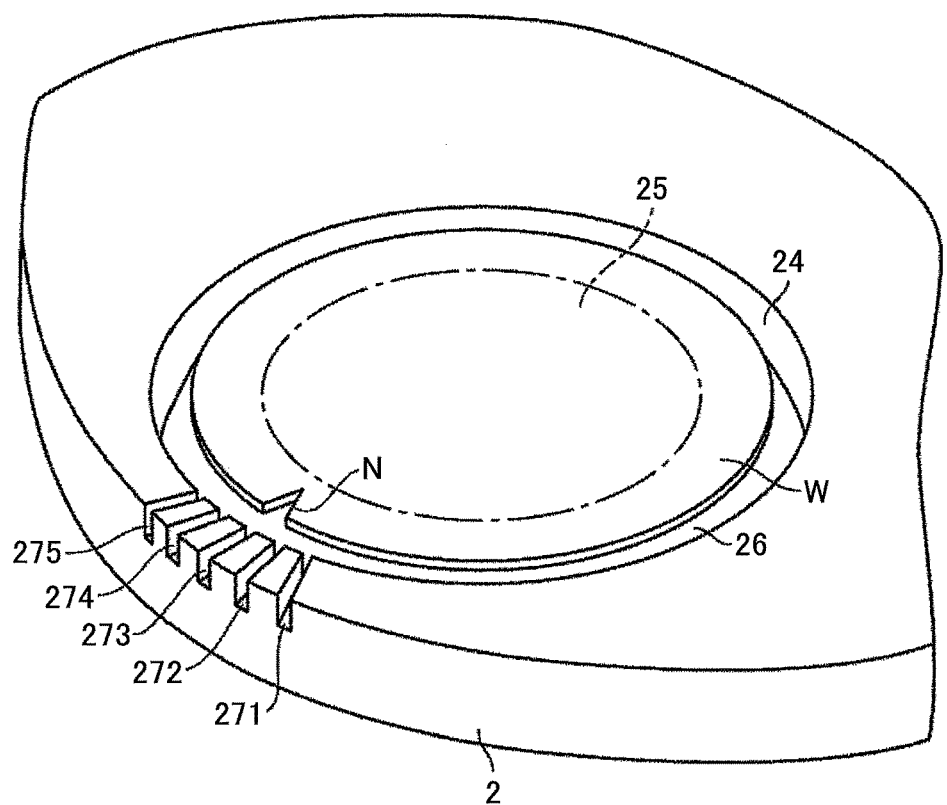
FIG. 5 is a perspective view illustrating a part of a turntable of a film deposition apparatus according to an embodiment of the present invention.
Figure 6:
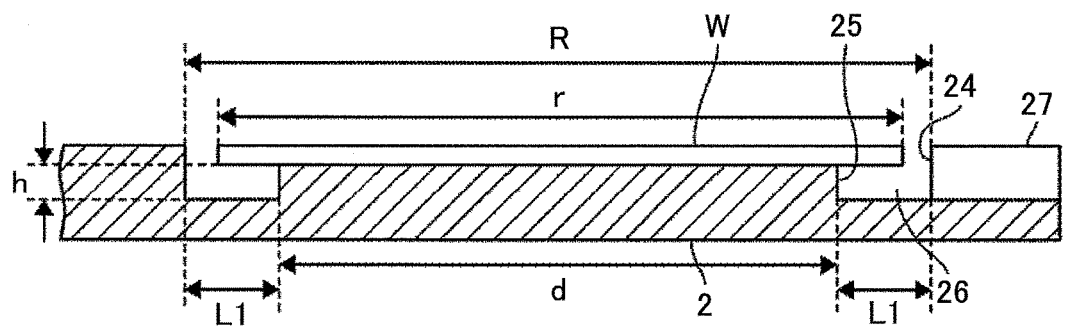
FIG. 6 is a vertical cross-sectional side view illustrating a part of the turntable.

As illustrated in FIGS. 4 through 6, pedestal portions 25 are provided to support a location inside the periphery of each of the wafers W. Each of the pedestal portions 25 is configured to have a flat cylindrical shape, and its upper surface is formed to be a horizontal plane. Each of the pedestal portions 25 is formed into a circular shape smaller than the wafer W when seen in a planar view in order to keep the peripheral portion of each of the wafers W above the bottom surface of each of the concave portions 24 throughout the entire circumference. For example, the center of the pedestal portion 25 and the center of the concave portion 24 are configured to coincide with each other when seen in a planar view. This causes a ring-shaped groove portion 26 to be formed between the inner wall surface of each of the concave portions 24 and an outer wall surface of each of the pedestal portions 25.

As illustrated in FIG. 6, a height dimension h of each of the pedestal portions 25 is set in a range from 0.1 to 1.0 mm, for example, at 0.4 mm. In this example, a height position of the surface of the wafer W and a height position of the turntable 2 are set to be even with each other when the wafer W is placed on the pedestal portion 25. A diameter dimension d of the pedestal portion 25 is, for example, 297 mm. When a width dimension of the above-mentioned groove portion 26 (the dimension between the inner wall surface of the concave portion 24 and the outer wall surface of the pedestal portion 25) is referred to as a "width dimension L1", the width dimension L1 is, for example, 3 mm. Here, in FIG. 6 and the like, the width dimension L1, the height dimension h and the like are hyperbolically enlarged.

Figure 7:
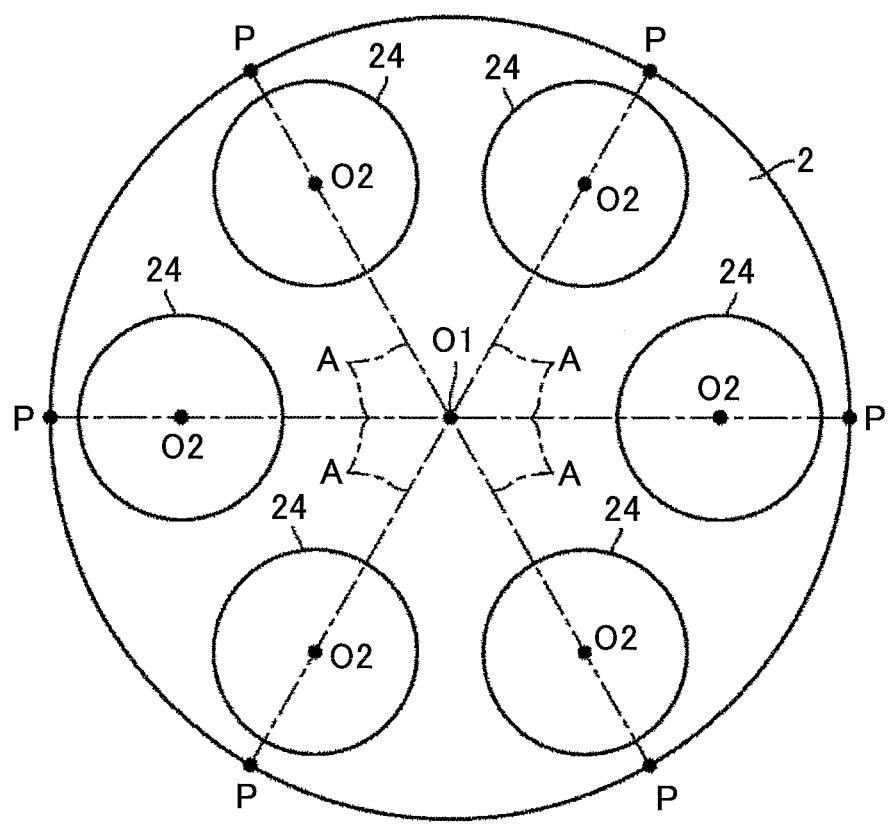
FIG. 7 is a schematic plan view illustrating the turntable.
Figure 8:
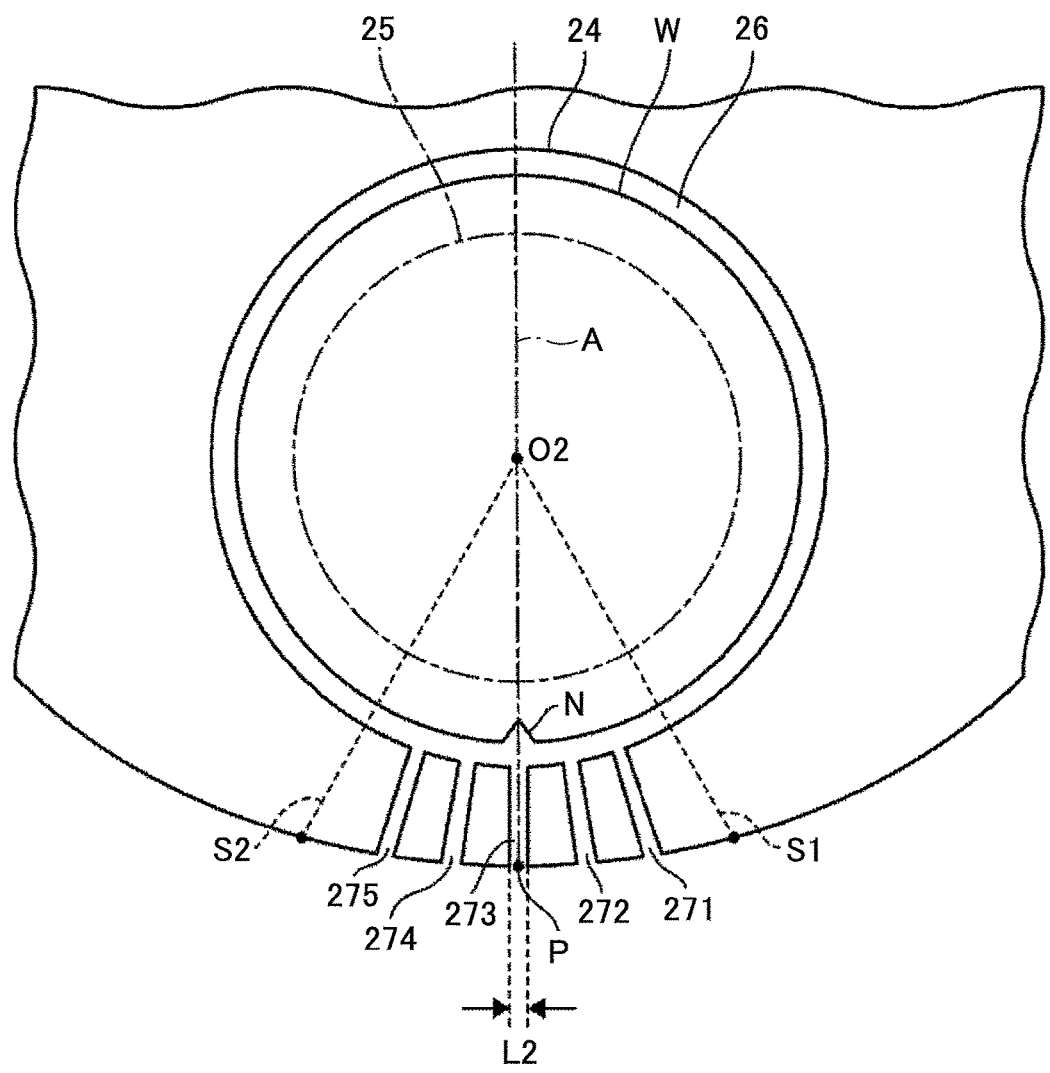
FIG. 8 is a plan view illustrating a part of the turntable.
Figure 9:
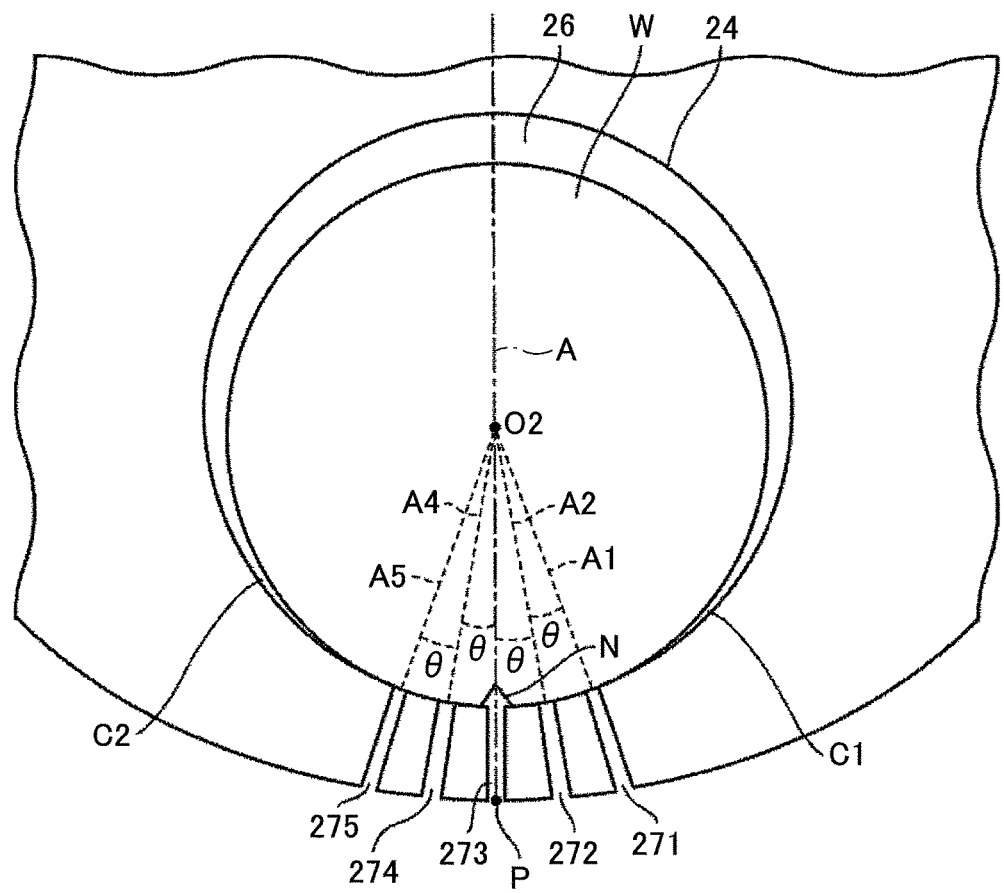
FIG. 9 is a plan view illustrating a part of the turntable.
Figure 10:
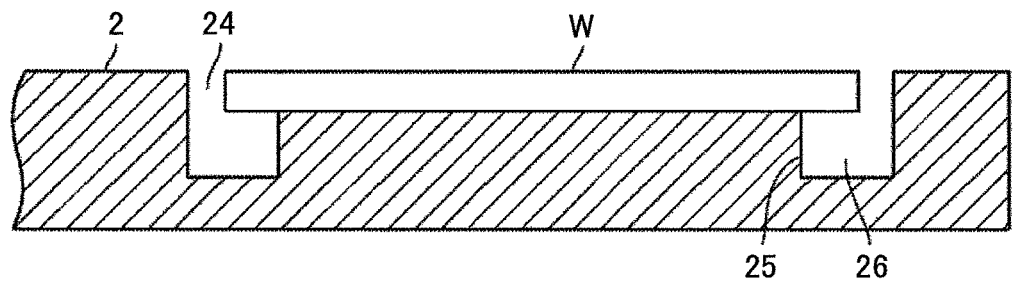
FIG. 10 is a vertical cross-sectional side view illustrating an action of the turntable.

As illustrated in FIGS. 5 and 6, communication passages are formed in a wall portion of each of the concave portions 24 so as to cause a space around the pedestal portion 25 in the concave portion 24 to be in communication with a space outside the turntable 2. In this example, the communication passage is provided as a plurality of narrow slits 27 (271 through 275). The plurality of slits 27 (271 through 275) is formed in an end area of the concave portion 24 opposite to the center of the turntable 2 when seen from the center of the concave portion 24. A description is given below of the end area with reference to FIGS. 7 through 9. As illustrated in FIGS. 7 and 8, when intersection points of straight lines A connecting the rotational center O1 of the turntable 2 with the centers O2 of the concave portions 24 and the outer circumference of the turntable 2 is expressed as P, the end area is an area between a straight line S1 extending from the center O2 toward the left at an angle of about 30 degrees with respect to a line connecting the center O2 with the intersection point P and a straight line S2 extending from the center O2 toward the right at an angle of about 30 degrees with respect to the line connecting the center O2 with the intersection point P. Here, FIG. 8 illustrates a state of the wafer W immediately after being placed on the pedestal portion 25, and FIG. 9 illustrates a state of the wafer W after moving toward the peripheral side of the turntable 2 due to the centrifugal force along with the rotation of the turntable 2. In this example, the wafer W is transferred to the pedestal portion 25 so as to face its notch N toward the end area, for example, the intersection point P.

As illustrated in FIGS. 5 through 9, each of the slits 271 through 275 is formed so that the groove portion 26 of the concave portion 24 is in communication with the surface in the periphery of the turntable 2 and the space outside the outer circumference of the turntable 2. These slits 271 through 275 are formed at intervals in the circumferential direction of the turntable 2, and for example, are configured by forming cut-outs with a length extending from the inner wall surface of the concave portion 24 to the outer circumference of the turntable 2 in the surface of the turntable 2.

In this example, the central slit 273 in the circumferential direction among five of the slits 271 through 275 is formed to be located on the straight line A connecting the center O1 of the turntable 2 with the center O2 of the concave portion 24. Two of the central slits 271 and 272 are provided on the upstream side of the slit 273 in the rotational direction of the turntable 2, and two of the slits 274 and 275 are provided on the downstream side of the central slit 273 in the rotational direction of the turntable 2. As illustrated in FIG. 9, for example, when straight lines A1, A2, A3, A4 and A5 connecting the center O2 of the concave portion 24 with the centers of the widths of the slits 271 through 275 (distance in the circumferential direction) are drawn, the slits 271 through 275 are radially formed so that each angle θ formed by straight lines adjacent to each other is made equal to each other, and in this example, the angle is set at, for example, 10 degrees. Each of the slits 271 through 275 is formed to have, for example, the same width along its lengthwise direction (radial direction), and widths L2 (see FIG. 8) of five of the slits 271 through 275 are set to be the same as each other. As an example of the dimension of the slits 271 through 275, the width L2 is set in a range of 2 to 10 mm, for example, at 6 mm.

Although the plurality of communication passages constituted of the slits 271 through 275 is formed in the end area in the above example, the embodiments are not limited to the example of having the communication passages formed only in the end area. For example, when a plurality of communication passages (slits) is formed, the embodiments of the present invention naturally include an embodiment in which one of the communication passages is formed in the end area and the other communication passages are formed in an area out of the end area.

Next, a description is given of each part of the film deposition apparatus again. As illustrated in FIGS. 2 and 3, five nozzles 31, 32, 34, 41 and 42 each made of, for example, quartz are arranged in a radial fashion at intervals in the circumferential direction of the vacuum chamber 1 at respective positions opposite to a passing area of the concave portions 24. In this example, a plasma generation gas nozzle 34, a separation gas nozzle 41, a first process gas nozzle 31, a separation gas nozzle 42 and a second process gas nozzle 32 are arranged in a clockwise fashion (in the rotational direction of the turntable 2) from a transfer opening 15 described later in this order. As illustrated in FIG. 1, a plasma generator 80 described later is provided above the plasma generation gas nozzle 34. The first process gas nozzle 31 forms a first process gas supply part, and the second process gas nozzle 32 forms a second process gas supply part. Each of the separation gas nozzles 41 and 42 forms a separation gas supply part. Here, FIGS. 2 and 4 illustrate a state of having removed the plasma generator 80 and a housing 90 that are described later. FIG. 3 illustrates a state of having installed the plasma generator 80 and the housing 90 in the chamber body 12.

Each of the gas nozzles 31, 32, 34, 41 and 42 is connected to the following gas supply source (not illustrated in the drawings) through a flow rate control valve. More specifically, the first process gas nozzle 31 is connected to a gas supply source for a source gas containing silicon (Si) such as 3DMAS (tris(dimethylamino)silane: $SiH[N(CH_3)_2]_3$). The second process gas nozzle 32 is connected to a gas supply source for a second process gas that reacts with the source gas such as a mixed gas of ozone ($O_3$) gas and oxygen ($O_2$) gas (more specifically, oxygen gas supply source including an ozonizor). The plasma generation gas nozzle 34 is connected to a gas supply source for a plasma generation gas such as a mixed gas of argon (Ar) gas and oxygen gas. Each of the separation gas nozzles 41 and 42 is connected to a gas supply source for nitrogen ($N_2$) gas. A plurality of gas discharge holes (not illustrated in the drawings) is formed, for example, in a lower surface of each of these gas nozzles 31, 32, 34, 41 and 42 along the radial direction of the turntable 2 (in the lengthwise direction of each of the gas nozzles 31, 32, 34, 41 and 42).

An area under the first process gas nozzle 31 is a first process area P1 to allow the first process gas to adsorb on the wafer W. An area under the second process gas nozzle 32 is a second process area P2 to cause a component of the first process gas adsorbed on the wafer W to react with the second process gas. Each of the separation gas nozzles 41 and 42 is provided to form a separation area D to separate the first process area P1 and the second process area P2 from each other. As illustrated in FIGS. 2 through 4, approximately sectorial convex portions 4 are provided on the ceiling plate 11 of the vacuum chamber 1 in the separation areas D. Each of the separation gas nozzles 41 and 42 is accommodated in each of the convex portions 4. Low ceiling surfaces are arranged on both sides of the separation gas nozzles 41 and 42 in the circumferential direction of the turntable 2 to prevent the process gases from mixing with each other, and ceiling surfaces higher than the low ceiling surfaces are arranged on both sides of the low ceiling surfaces in the circumferential direction. The peripheries of the convex portions 4 (peripheral locations of the vacuum chamber 1) are bent to form a L-letter shape so as to face the outer end surface of the turntable 2 and to be slightly apart from the chamber body 12 in order to prevent the process gases from mixing with each other.

The plasma generator 80 is configured by winding an antenna 83 made of a metal wire in a coil form. The antenna 83 is, for example, connected to a high frequency power source 85 having a frequency of 13.56 MHz and an output power of 5000 W by way of a matching box 84. The ceiling plate 11 above the plasma generation gas nozzle 34 has an opening 11a having an approximately sectorial shape when seen in a plan view. The opening 11a is hermetically sealed by the housing 90 made of, for example, quartz, and the antenna 83 is installed in the housing 90. As illustrated in FIG. 1, a connection electrode 86 is provided to electrically connect the plasma generator 80 with the matching box 84 and the high frequency power source 85. Furthermore, a projection portion 92 for gas regulation is provided to prevent $N_2$ gas, $O_3$ gas and the like from intruding into an area below the housing 90.

As illustrated in FIGS. 1 and 3, a grounded Faraday shield 95 having a box-like shape whose top is open and made of a metal material is disposed between the housing 90 and the antenna 83. Many slits 97 are formed in the bottom surface of the Faraday shield 95 in order to allow a magnetic field component to reach the wafer W among an electric field and a magnetic field (i.e., electromagnetic field) generated by the antenna 83 and to prevent an electric field component from going downward. An insulating plate 94 made of, for example, quartz is provided between the Faraday shield 95 and the antenna 83.

A side ring 100 is disposed outside the outer circumference of the turntable 2. Exhaust openings 61 and 62 that are open in the vacuum chamber 1 are formed in an upper surface of the side ring 100 at two locations apart from each other in the circumferential direction. The first exhaust opening 61 is formed at a location closer to the separation area D than the first process gas nozzle 31 between the first process gas nozzle 31 and the separation area D on the downstream side of the first process gas nozzle 31 in the rotational direction of the turntable 2. The second exhaust opening 62 is formed at a location closer to the separation area D than the plasma generation gas nozzle 34 between the plasma generation gas nozzle 34 and the separation area D on the downstream side of the plasma generation gas nozzle 34 in the rotational direction of the turntable 2.

The first exhaust opening 61 is to evacuate the first process gas and the separation gas, and the second exhaust opening 62 is to evacuate the plasma generation gas in addition to the second process gas and the separation gas. A groove-like gas flow passage 101 is formed in the upper surface of the side ring 100 on the outer edge side of the housing 90 to allow the gas to flow to the second opening 62. As illustrated in FIG. 1, each of the first exhaust opening 61 and the second exhaust opening 62 is, connected to an evacuation mechanism such as a vacuum pump 64 through an exhaust pipe 63 including a pressure controller 65 such as a butterfly valve.

As illustrated in FIG. 2, in the center portion on the lower surface of the ceiling plate 11, a protrusion portion 5 is provided that is formed into an approximately ring-like shape along the circumferential direction continuously extending from a location on the central area C side of the convex portion 4 so as to have a lower surface formed as high as the lower surface of the convex portion 4. A labyrinth structure 110 is provided closer to the rotational center side of the turntable 2 than the protrusion portion 5 and above the core portion 21 to suppress the various gases from mixing with each other in the central area C.

As illustrated in FIGS. 2 and 3, a transfer opening 15 is formed in the side wall of the vacuum chamber 1 to transfer the wafer W between an external transfer arm (not illustrated in the drawings) and the turntable 2. The transfer opening 15 is configured to be hermetically openable and closable by a gate valve G. Moreover, lift pins (not illustrated in the drawings) are provided under the turntable 2 at a location facing the transfer opening 15 to lift the wafer W from its back surface via the through holes 24a of the concave portion 24.

Moreover, as illustrated in FIG. 1, a control unit 120 constituted of a computer to control operation of the entire apparatus is provided in the film deposition apparatus according to the embodiment. A program to implement a film deposition process and a modification process described later is stored in a memory of the control unit 120. This program is constituted of instructions of step groups to cause the apparatus to implement operations described later, and is installed into the control unit 120 from a memory unit 121 that is a storage medium such as a hard disk, a compact disc, a magnetic optical disk, a memory card and a flexible disk.

Next, a description is given below of an action of the film deposition apparatus according to the embodiment discussed above. The turntable 2 is preliminarily heated by the heater unit 7 so as to set a wafer W placed on the turntable 2 at a film deposition temperature, for example, about 620 degrees C. To begin with, the gate valve G is opened. Then, multiple, for example, six wafers W are placed on the turntable 2 by the transfer arm (not illustrated in the drawings) through the transfer opening 15 while rotating the turntable 2 intermittently.

Figure 11:
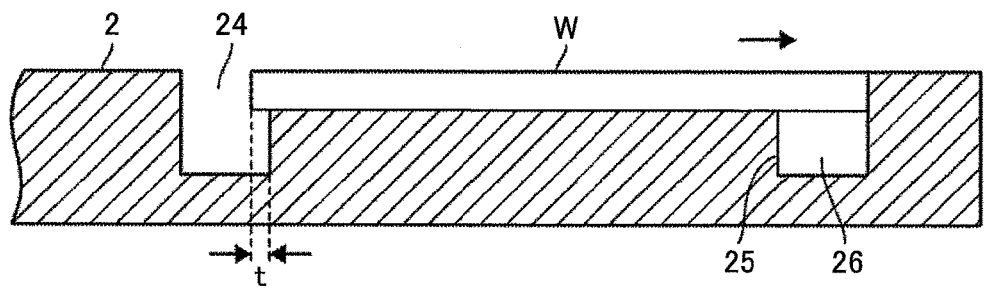
FIG. 11 is a vertical cross-sectional side view illustrating an action of the turntable.

Next, the gate valve G is closed, and the turntable 2 is rotated in a range of 20 to 240 rpm, for example, at 180 rpm in a clockwise fashion while the vacuum pump 64 continues to evacuate the vacuum chamber 1. As illustrated in FIGS. 9 and 11, each of the wafers W approaches the peripheral side of the turntable 2 within the concave portion 24 due to a centrifugal force caused by the rotation of the turntable 2, and the outer edge of each of the wafers W contacts the side wall (inner wall surface) of each of the concave portion 24. As illustrated in FIG. 9, when the wafer W contacts the concave portion 24 in this manner, a location that is the closest to the center O1 of the turntable 2 of the outer edge of the wafer W has the greatest distance from the inner wall of the concave portion 24, and the shortest protruding length dimension t from the edge of the pedestal portion 25. In this example, the length dimension t is set at about 1 to 2 mm (see FIG. 11).

When the turntable 2 is rotated from a stationary state, because each of the wafers W is likely to stay still, each of the wafers W is likely to move to the downstream side in the rotational direction of the turntable 2 (direction opposite to the travelling direction of the turntable 2). However, as discussed above, because the wafer W is pressed by the centrifugal force so that the outer edge of the wafer W contacts the inner wall surface of the concave portion 24, a position of the wafer W in the rotational direction of the turntable 2 is regulated by the concave portion 24 and the centrifugal force. This causes the wafer W to move while the wafer W substantially maintains a relative positional relationship between the notch N thereof and the intersection point P in the circumferential direction.

The process gas nozzle 31 and 32 discharge a first process gas and a second process gas, respectively, and the plasma generation gas nozzle 34 discharges a plasma generation gas. Each of the separation gas nozzles 41 and 42 discharges a separation gas at a predetermined flow rate, and each of the separation gas supply pipe 51 and the purge gas supply pipes 72 and 73 discharges nitrogen gas at a predetermined flow rate. The pressure of the vacuum chamber 1 is adjusted to a preliminarily set processing pressure in a range of 133 to 1333 Pa, for example, at 1260 Pa (9.5 Torr) by the pressure controller 65, and a high frequency power is supplied to the plasma generator 80.

The first process gas (source gas) adsorbs on surfaces of the wafers W in the first process area P1, and then the first process gas (source gas) adsorbed on the wafers W reacts with the second process gas (reaction gas) in the second process area P2 by the rotation of the turntable 2. This causes a reaction product made of one or more molecular layers of a silicon oxide film ($SiO_2$) that is a component of a thin film to be formed on the surfaces of the wafers W. In the meantime, only the magnetic field of the electric field and the magnetic field generated by the high frequency power supplied from the high frequency power source 85 reaches the inside of the vacuum chamber 1 by passing through the slits 97 of the Faraday shield 95 under the plasma generator 80. Accordingly, the plasma generation gas discharged from the plasma generation gas nozzle 34 is activated by the magnetic field, and active species such as ions or radicals are generated by plasma, thereby performing a modification process of the reaction product. More specifically, the collision of the plasma against the surfaces of the wafers W causes, for example, the reaction product to release impurities therefrom, or to be densified due to rearrangement of elements within the reaction product. Thus, by continuing to rotate the turntable 2, the adsorption of the first process gas on the surfaces of the wafers W, the reaction of the second process gas with the first gas adsorbed on the surfaces of the wafers W and the plasma modification of the reaction product are performed many times in this order, and the thin film is formed by depositing the reaction product in a layer-by-layer manner.

Figure 12:
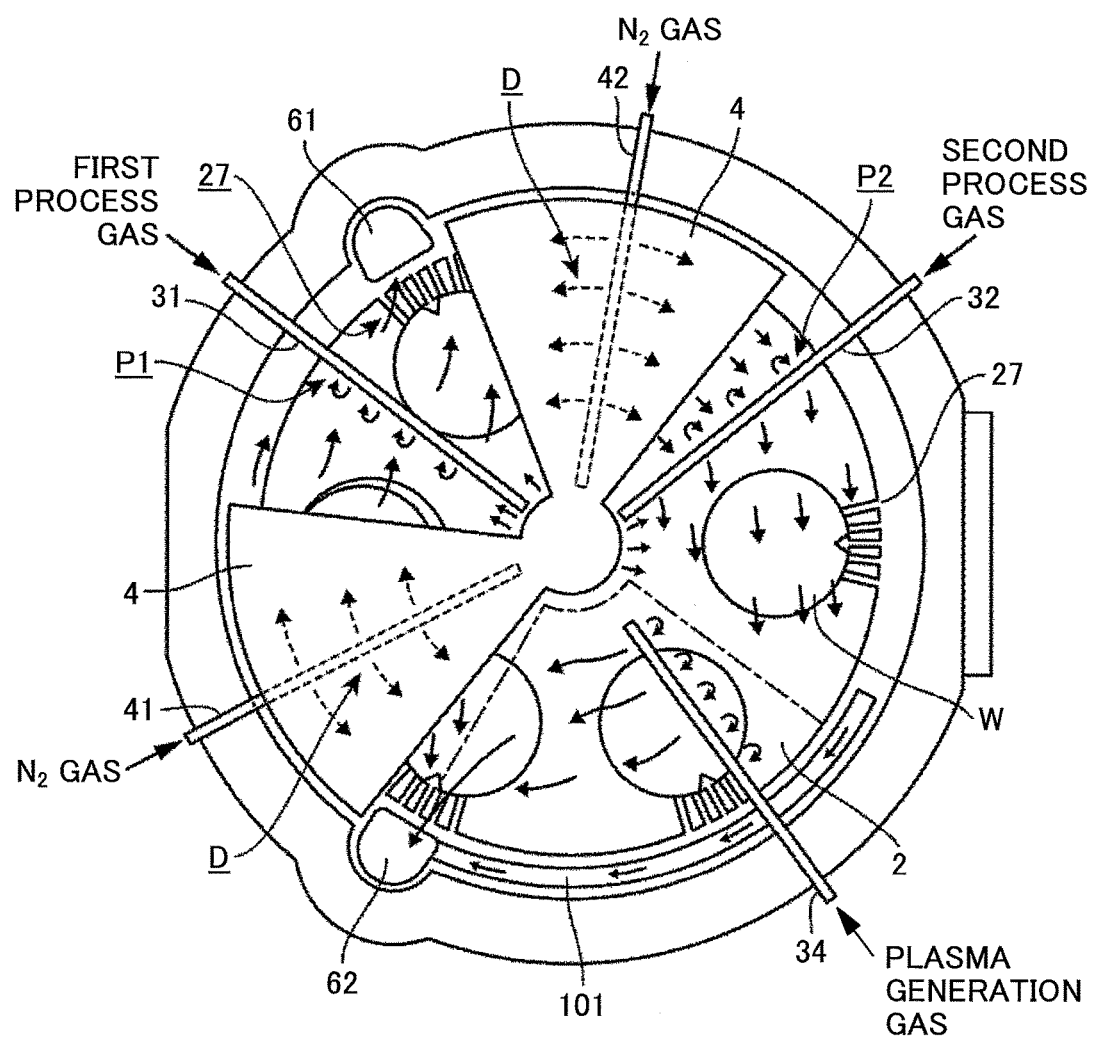
FIG. 12 is a plan view illustrating a flow in a film deposition apparatus according to an embodiment of the present invention.

FIG. 12 is a lateral cross-sectional view of the vacuum chamber 1, and illustrates gas flows in each location during the film deposition process by arrows. As illustrated in FIG. 12, because the separation gas is supplied to two of the separation areas D between the first process area P1 and the second process area P2, the first process gas and the separation gas flow to the first exhaust opening 61 and are evacuated therefrom, and the second process gas and the separation gas flow to the second exhaust opening 62 and are evacuated therefrom, respectively, so as to prevent the first process gas and the second process gas from mixing with each other. Moreover, because the purge gas is supplied to the space below the turntable 2, the gas likely to diffuse to the space below the turntable 2 is pushed back toward the first and second exhaust openings 61 and 62 by the purge gas.

Figure 13:
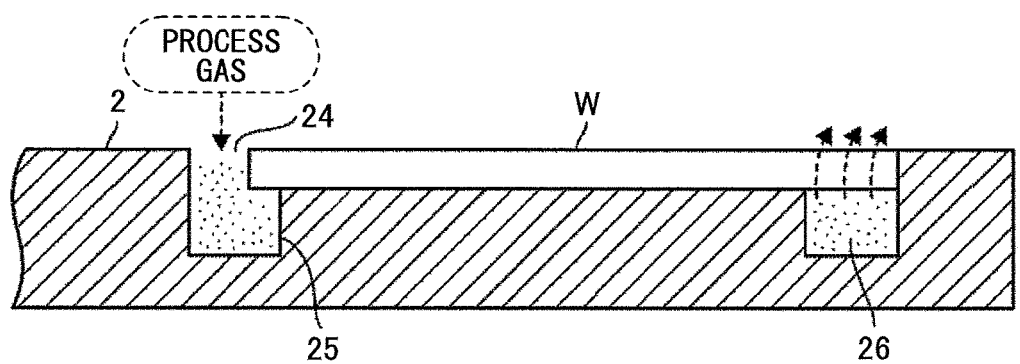
FIG. 13 is a vertical cross-sectional side view illustrating an action of the turntable.
Figure 14:
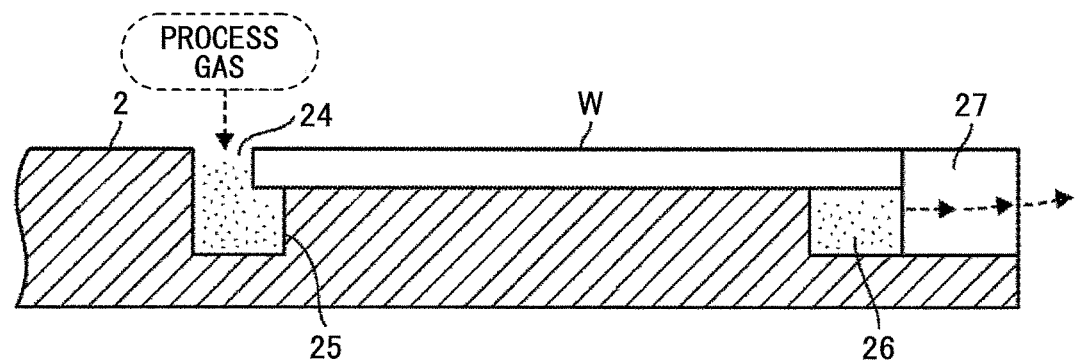
FIG. 14 is a vertical cross-sectional side view illustrating an action of the turntable.

Subsequently, a description is given below of the first and second process gases supplied to the wafers W. As illustrated in FIGS. 13 and 14, each of the process gases supplied to the wafer W is likely to flow to an area under the back surface of the wafer W (the groove portion 26) through a gap between the outer edge of the wafer W and the inner wall surface of the concave portion 24. The behavior of the gas within the groove portion 26 is inferred as follows. To begin with, a description is given below of a case of not providing the slits 27. As discussed above, and as illustrated in FIG. 13, the outer edge of the wafer W is pressed against the inner wall surface of the concave portion 24 by the centrifugal force caused by the rotation of the turntable 2, and the upper side of the groove portion 26 is closed by the wafer W. Furthermore, when the rotational speed of the turntable 2 is as high as about 180 rpm, the process gas approaches the peripheral side of the turntable 2 in the groove portion 26 of the concave portion 24. Because an area where the process gas approaches within the concave portion 24 is the area whose top is closed by the wafer W, the process gas is unlikely to flow out of the area, and the process gas is likely to stay in the area. In addition, when the pressure of the processing atmosphere is as high as about 1.26 kPa (9.5 Torr), because an amount of process gas supplied into the vacuum chamber 1 becomes a lot, as a result, the gas remaining in the vicinity of the lower surface of the outer edge of the wafer W pressed against the inner wall surface of the concave portion 24 becomes a lot.

In this manner, as illustrated in FIGS. 9 and 13, the gas remaining in the vicinity of the lower surface of the wafer W flows out of clearances C1 and C2 between the wafer W and the inner wall surface of the concave portion 24 on both sides of a location where the outer edge of the wafer W contacts the inner wall surface of the concave portion 24. In the meantime, as illustrated in FIG. 12, the gas flows toward the second exhaust opening 62, that is to say, toward the downstream in the rotational direction between the second process gas nozzle 32 and the separation area D on the downstream side of the second process gas nozzle 32. Because of this, the gas having flown out of the clearances C1 and C2 on both sides of the wafer W curls up to an area above the upper surface of the turntable 2 and flows toward the second exhaust opening 62. Here, the process gas is thought to be likely to flow out of the clearance C2 more than out of the clearance C1 because the clearance C2 is closer to the second exhaust opening 62 than the clearance C1. Furthermore, the gas having flown out of the clearance C2 is thought to adsorb on the surface of the wafer W on the upstream side of the clearance C2 in the rotational direction because the wafer W passes through the gas dispersed upward to the area above the upper surface of the turntable 2 through the clearance C2.

In addition, as discussed above, when the notch N is located at the peripheral side of the turntable 2 within the concave portion 24, the process gas flows out of the notch N and adsorbs on the surface of the wafer W. An amount of gas supplied to the location of the wafer W near the outer circumference of the turntable 2 (the neighborhood of the notch N in this example) is thought to increase coupled with such matters, and the film thickness of the location is thought to locally increase more than the other area. Moreover, for example, even when the location of the notch N is set at the central side of the turntable 2, the film thickness is acknowledged to be thicker than the other location even though a degree of increase of the film thickness decreases.

In contrast, when the slits 271 through 275 are formed in the turntable 2, the following is inferred. That is, because the vacuum chamber 1 is evacuated through the first and second exhaust openings 61 and 62 provided outside the slits 271 through 275, as illustrated in FIG. 14, the gas approaching the outer circumference of the turntable 2 within the concave portion 24 is evacuated to the outer circumference side of the concave portion 24 through the slit 27. Although the slits 271 through 275 are opened in the upper surface of the turntable 2, because the gas is evacuated from the outer edge side, most of the gas within the concave portion 24 flows toward the first and second exhaust openings 61 and 62 through the lateral side of the turntable 2. This causes the amount of gas flowing to the wafer receiving area of the turntable 2 to be extremely reduced, and a state of excessively supplying the process gas to only a part of the periphery of the wafer W is prevented. In this manner, occurrence of a phenomenon of a local increase of the film thickness in a part of the periphery of the wafer W more than the other area can be prevented.

According to the embodiment discussed above, the communication passage (slit 27) is formed in the wall portion of the concave portion 24 so that the groove portion 26 within the concave portion 24 is in communication with the space outside the turntable 2 at the location close to the outer circumference side of the turntable 2 within the concave portion 24. Hence, the gas approaching the peripheral side of the turntable 2 within the concave portion 24 is quickly discharged through the slit 27 due to the centrifugal force caused by the rotation of the turntable 2. This causes the process gas to flow out of the turntable 2 without remaining inside of the concave portion 24 even when a large amount of process gas is likely to move to the periphery of the turntable 2 in the process of rotating the turntable 2 at a high rotational speed under a high process pressure.

Thus, the process gas having flown to the back side of the wafer W is evacuated without reaching the surface of the wafer W, which makes it possible to prevent the amount of gas supply from increasing in the periphery of the wafer W and to obtain preferable uniformity of the film thickness across the wafer W by reducing the occurrence of the location having a film thickness thicker than another location. Here, even in performing a process other than the process of rotating the turntable 2 at a high rotational speed under a high processing pressure, that is, a process of rotating the turntable 2 at a rotational speed of 120 rpm under a processing pressure of 0.89 kPa (6.7 Torr), the preferable uniformity of film thickness can be obtained. Hence, according to the configuration of discharging the gas within the concave portion 24 to the outside of the turntable 2 by providing the communication passage for the concave portion 24 of the embodiment of the present invention, a process capable of acquiring the preferable uniformity of film thickness across the film can be performed under various process conditions. This makes it possible to broaden an implementable process range for a single film deposition apparatus, thereby improving the general versatility of the film deposition apparatus.

Moreover, as discussed above, by forming the plurality of slits 271 through 275, the gas within the concave portion 24 is dispersedly discharged from the plurality of slits 271 through 275, and an amount of gas discharged through each of the slits 271 through 275 is averaged. Due to this, the gas is unlikely to disperse upward to an area above the upper surface of the wafer W when the gas is discharged from the slits 271 through 275, and the occurrence of the location having a greater film thickness than another location can be suppressed, and therefore the configuration of forming the plurality of communication passages is further preferable.

In this example, the slit 27 is formed in the end area between the lines S1 and S2 that make opening angles of 30 degrees to the right and left with the straight line connecting the center O2 of the concave portion 24 to the intersection point P. By forming the slit 27 in the end area, the gas is reliably and quickly discharged because the process gas is likely to stay in the groove portion 26 in the vicinity of the end area due to the centrifugal force caused by the rotation of the turntable 2. In addition, the slit 27 is formed in the inner wall surface (side wall) of the concave portion 24, and the exhaust openings 61 and 62 are provided so as to open into the vacuum chamber 1 at a location outside the outer circumference of the turntable 2 when seen in a planar view. This causes the gas in the concave portion 24 to be likely to be released to the lateral side of the turntable 2, thereby reliably preventing the gas from dispersing upward to an area above the upper surface of the wafer W.

Figure 15:
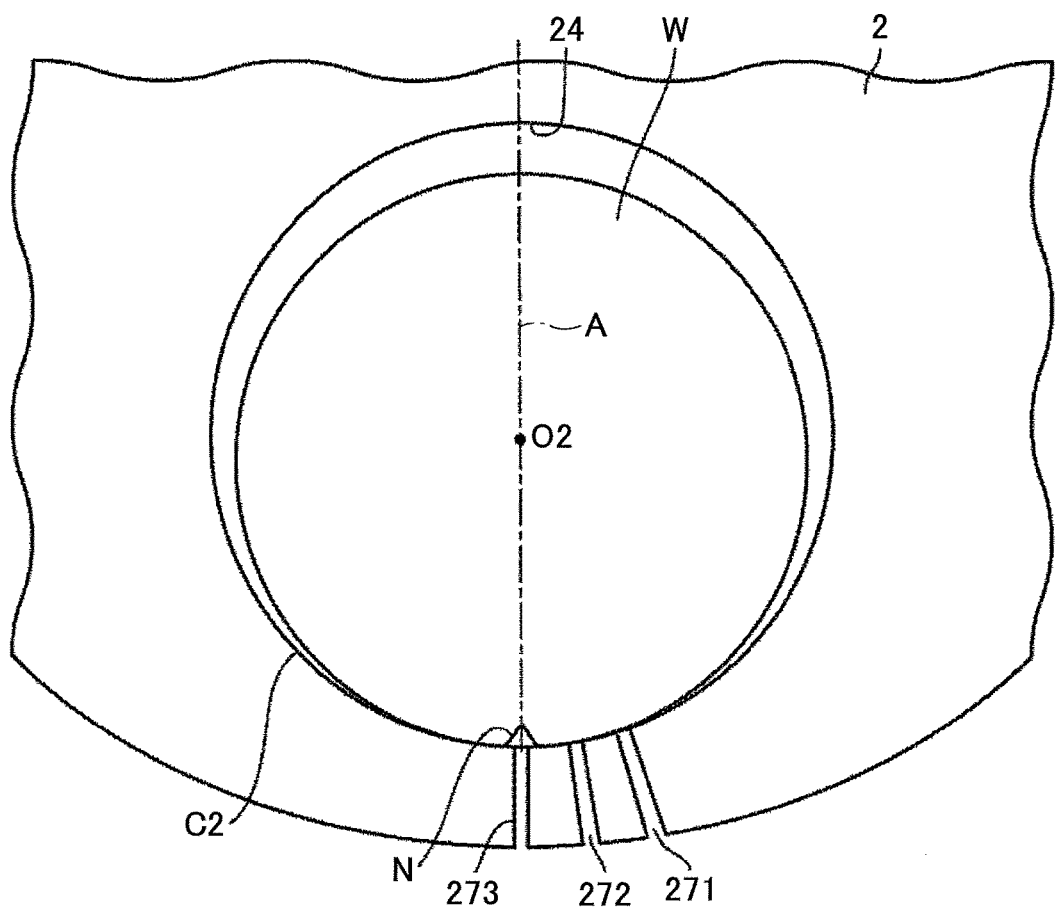
FIG. 15 is a plan view illustrating another example of a turntable.

As discussed above, it is thought that the film thickness becomes locally thick because the gas flowing out of the clearance C2 on the downstream side in the rotational direction of the turntable 2 adsorbs on the surface of the wafer W. Accordingly, the communication passage only has to be arranged at least on the upstream side in the rotational direction of the turntable 2 when seen from the straight line A connecting the center O2 of the concave portion 24 with the rotational center O1 of the turntable 2. When the communication passage is formed in the end area, because the gas in the concave portion 24 is discharged to the outside of the turntable 2 from the upstream side of the straight line A in the rotational direction, the outflow of the gas from the clearance C2 is reduced, thereby preventing the local gas supply to the wafer W. Thus, as illustrated in FIG. 15, even when the turntable 2 is configured to have only the slit 273 formed on the straight line A and the slits 271 and 272 provided on the upstream side in the rotational direction of the turntable 2, the preferable uniformity of film thickness across the film can be ensured.

Second Embodiment

Next, a description is given below of another embodiment of the present invention with reference to FIGS. 16 and 17. The embodiment differs from the first embodiment in that a communication passage constituted of a cut-out portion 28 having a broader width than that of the first embodiment is formed in the end area of the concave portion 24 opposite to the center O1 of the turntable 2 when seen from the center O2 of the concave portion 24 of the turntable 2 instead of the plurality of narrow slits 271 through 275. The cut-out portion 28 is formed in the wall portion of the concave portion 24 so that the groove portion 26 of the concave portion 24 is in communication with a space on the upper surface side and on the lateral side of the periphery of the turntable 2. The other configuration is similar to that of the above-discussed first embodiment. In this configuration, because the gas approaching the outer circumferential side of the turntable 2 in the concave portion 24 is also discharged to the outside of the turntable 2 through the cut-out portion 28, the outflow of the gas from the clearance C2 to the area above the upper surface of the turntable 2 is reduced, thereby ensuring the preferable uniformity of film thickness across the film.

Figure 16:
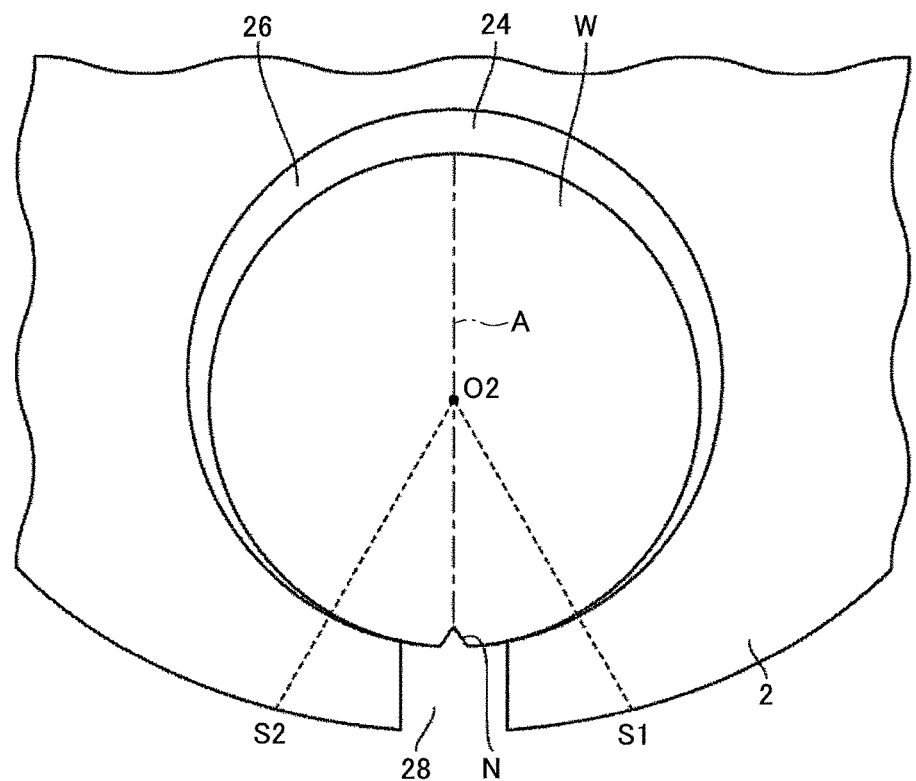
FIG. 16 is a plan view illustrating still another example of a turntable.
Figure 17:
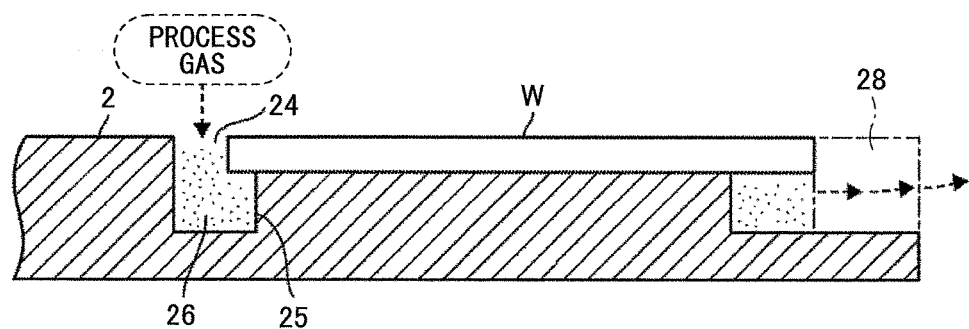
FIG. 17 is a vertical cross-sectional side view illustrating an action of another example of the turntable.
Figure 18:
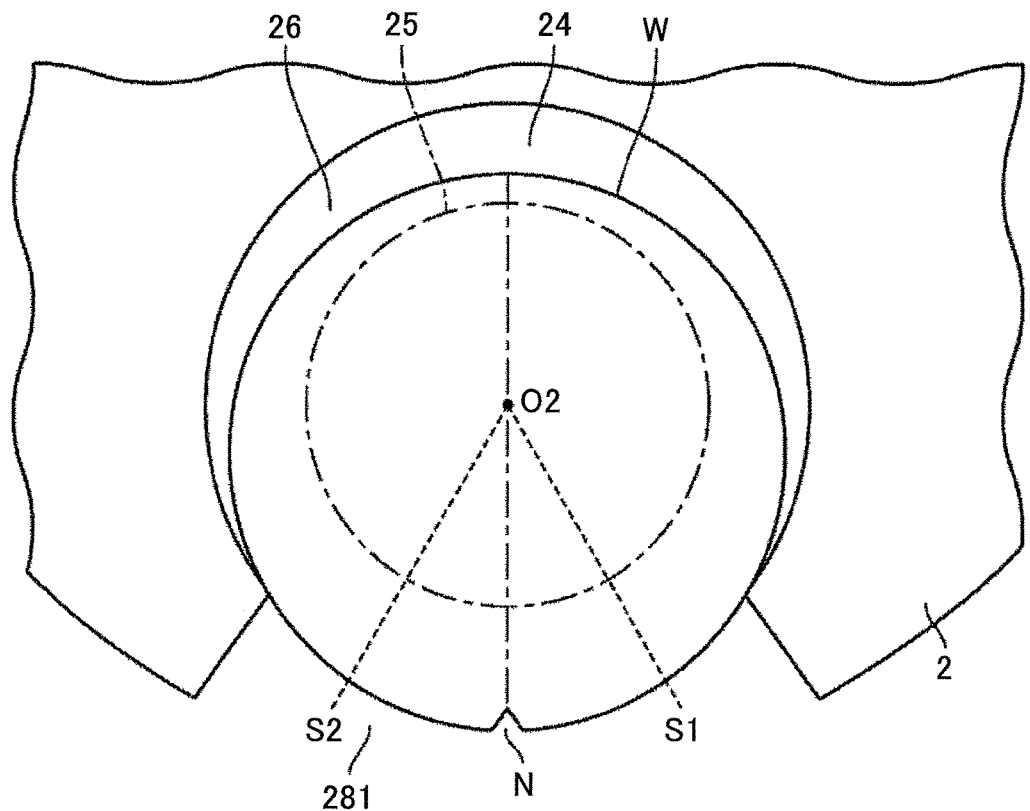
FIG. 18 is a plan view illustrating still another example of a turntable.
Figure 19:
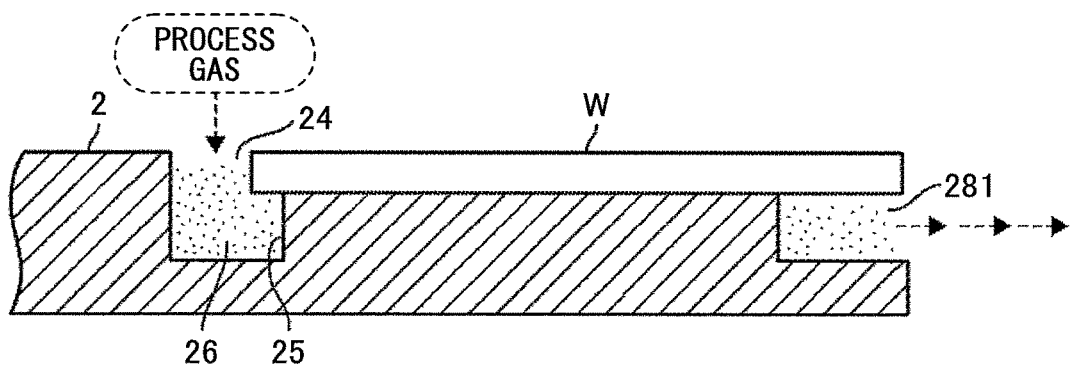
FIG. 19 is a vertical cross-sectional side view illustrating an action of still another example of the turntable.

Moreover, by broadening the width of the cut-out portion 28 (length in the circumferential direction) illustrated in FIG. 16, a cut-out portion 281 having a shape illustrated in FIGS. 18 and 19 may be made a communication passage. This configuration is the same as the configuration including the cut-out portion 28 illustrated in FIG. 16 except that the width of the cut-out portion 281 is broader than that of the cut-out portion 280. This cut-out portion 281 is formed to have the width smaller than the diameter of the wafer W when seen in a planar view so that the wafer W is not out of the turntable 2. In this example, although the cut-out portion 281 includes the end area between the straight lines S1 and S2 and is formed to be larger than the end area, this example is also within the scope of the present invention.

Figure 20:
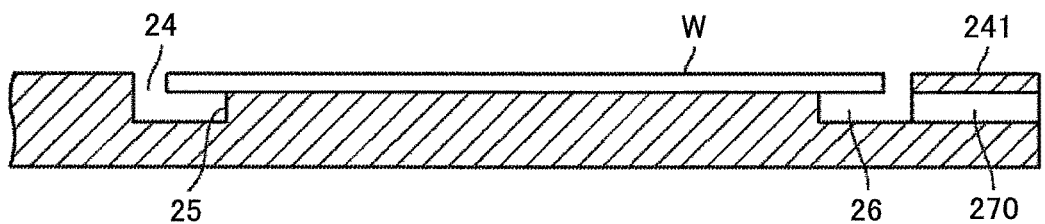
FIG. 20 is a vertical cross-sectional side view illustrating still another example of a turntable.

Furthermore, the communication passage may be configured as illustrated in FIG. 20. Even in this example, an approximately horizontal communication passage 270 penetrating through a side wall portion 241 of the concave portion 24 is formed in the end area of the concave portion 24 opposite to the center O1 of the turntable 2 when seen from the center of the concave portion 24 of the turntable 2. This communication passage 270 is formed so that the groove portion 26 of the concave portion 24 is in communication with a space on the lateral side of the outer circumference of the turntable 2. The other configuration is similar to that of the first embodiment. Even in this example, the gas approaching the outer circumferential side of the turntable 2 within the concave portion 24 is discharged to the outside of the turntable 2 through the communication passage 270, thereby ensuring the preferable uniformity of film thickness across the film. In addition, the communication passage 270 may be configured to make an open end in the upper surface or the lower surface of the turntable 2 by bending the communication passage 270 in an L-letter form instead of making the open end in the side surface of the turntable 2.

Third Embodiment

Figure 21:
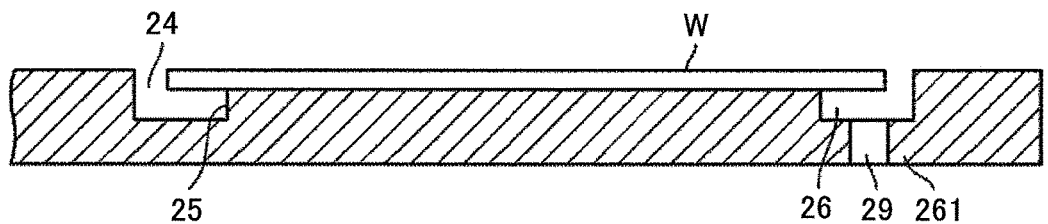
FIG. 21 is a vertical cross-sectional side view illustrating still another example of a turntable.

Subsequently, a description is given below of another embodiment of the present invention with reference to FIG. 21. This embodiment differs from the first embodiment in that a communication passage 29 is formed in the bottom portion of the concave portion 24 instead of providing the communication passage 29 in the side wall portion of the concave portion 24. This communication passage 29 is formed in a bottom portion 261 of the groove portion 26 of the concave portion 24 in the end area of the concave portion 24 opposite to the center O1 of the turntable 2 when seen from the center of the concave portion 24 of the turntable 2. The communication passage 29 is formed so that the groove portion 26 is in communication with a space under the turntable 2 in the vicinity of the periphery of the turntable 2. The configuration of the third embodiment is similar to that of the first embodiment except that the communication passage 29 is provided in the bottom portion 261 of the concave portion 24 instead of the side wall portion 241 of the concave portion 24.

Even when the communication passage 29 is provided in this manner, because the exhaust openings 61 and 62 are formed outside the communication passage 29 and on the lateral side of the communication passage 29 of the outer circumferential side of the turntable 2, the gas within the concave portion 24 flows to the space below the turntable 2 through the communication passage 29 and is discharged from the exhaust openings 61 and 62. Hence, the outflow of the gas from the clearance C2 to an area above the upper surface of the turntable 2 is reduced, which makes it possible to ensure the preferable uniformity of film thickness across the film.

Figure 22:
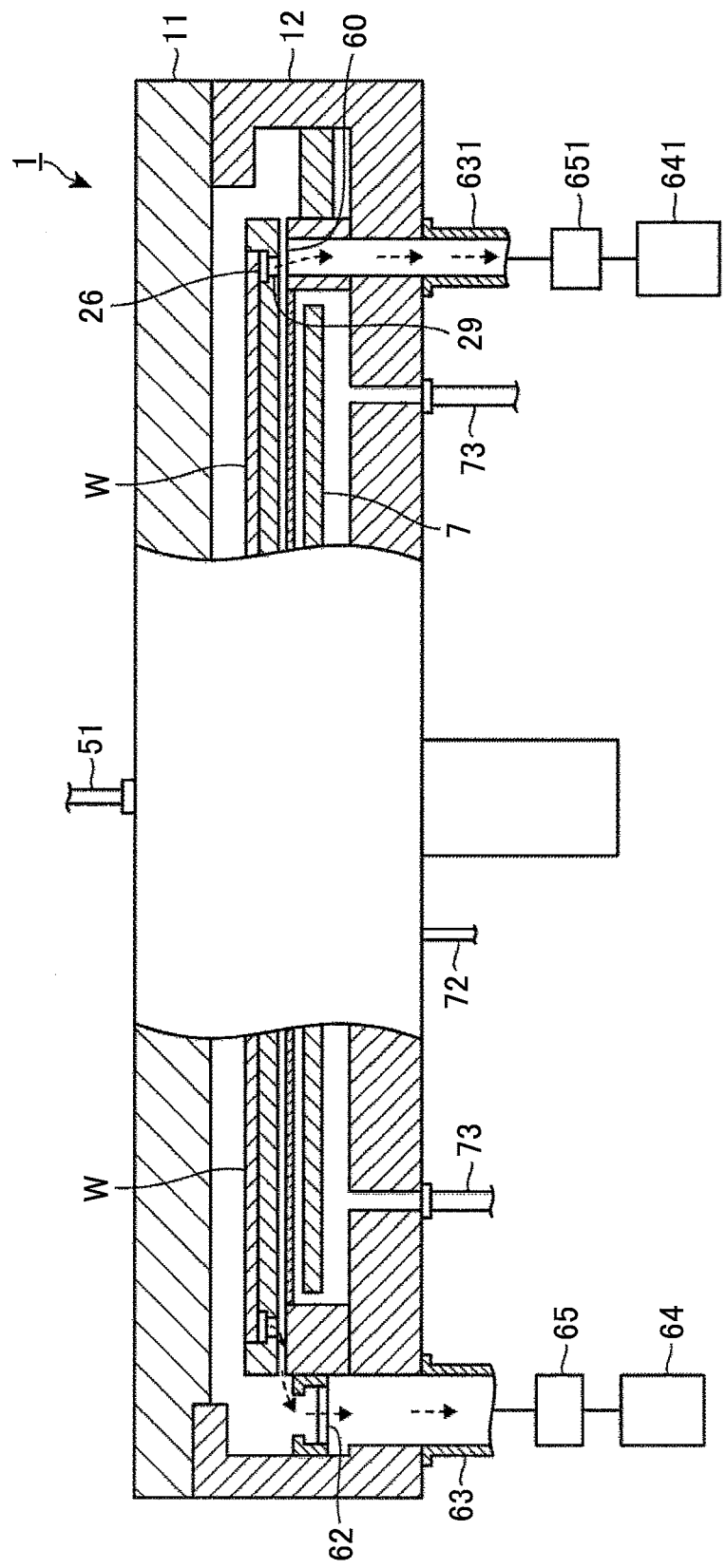
FIG. 22 is a vertical cross-sectional side view illustrating another example of a film deposition apparatus according to an embodiment of the present invention.

Moreover, as illustrated in FIG. 22, by providing an exhaust opening 60 in the vicinity of a passing area of the communication passage 29 under the turntable 2 in addition to the exhaust openings 61 and 62 of the first embodiment, the gas may be exhausted from the communication passage 29. In FIG. 22, an exhaust pipe 631, a pressure controller 651 and a vacuum pump 641 are provided.

Figure 23:
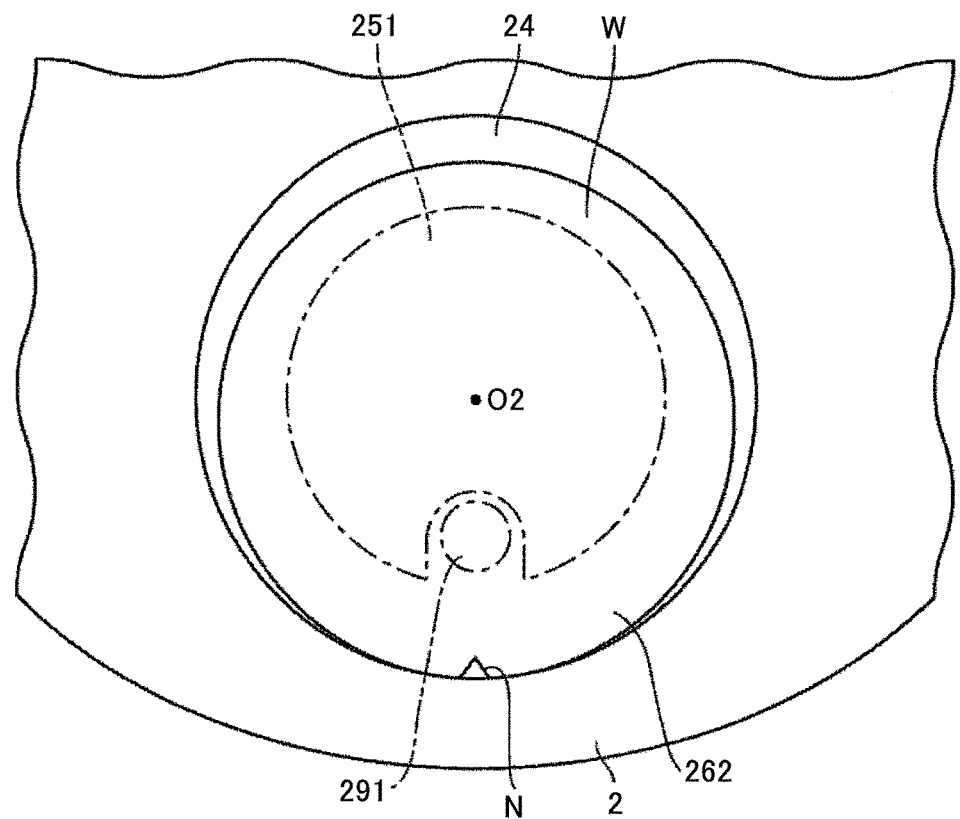
FIG. 23 is a plan view illustrating still another example of a turntable.

Furthermore, as illustrated in FIG. 23, an area in the pedestal portion 251 opposite to the center O1 of the turntable 2 when seen from the center of the concave portion of the turntable 2 is recessed toward the center O2 of the concave portion 24 in a planar view, and a communication passage 291 may be provided in the bottom surface of the recessed area. In this example, a groove portion 262 has a part having a recessed shape toward the pedestal portion 251, and the communication passage 291 is formed in the bottom surface in the area recessed toward the pedestal portion 251. This configuration is similar to the configurations in FIGS. 21 and 22 except that a position of the communication passage 291 differs from that in FIGS. 21 and 22.

Figure 24:
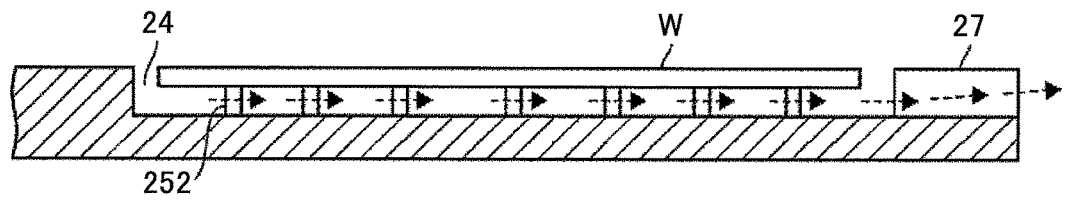
FIG. 24 is a vertical cross-sectional side view illustrating still another example of a turntable.

In addition, as illustrated in FIG. 24, according to another embodiment of the present invention, a plurality of projecting portions 252 is provided instead of the pedestal portion 251 having a cylindrical shape, and the plurality of projecting portions 252 may support the wafer W. Even in this case, the communication passages of the first, second and third embodiments can be applied to this embodiment, and the configuration is similar to the above embodiments except that the plurality of projecting portions 252 is provided instead of the pedestal portion 25. FIG. 24 illustrates a configuration including the slit 27 of the first embodiment. The gas flowing into the concave portion 24 moves to the periphery of the turntable 2 by passing through a space between the projecting portions 252, and is discharged from the slit 27. This prevents the gas from flowing to an area above the upper surface of the turntable 2 out of the clearance C2, thereby ensuring the preferable uniformity of film thickness across the film.

In the embodiments of the present invention, the center of the concave portion and the center of the pedestal portion may not coincide with each other. For example, the center of the pedestal portion may be eccentrically disposed relative to the center of the concave portion. The planar shape of the concave portion and the pedestal portion is not limited to the circle. Furthermore, the embodiments of the present invention can be applied to a case in which an electrostatic chuck is provided in the pedestal portion and the wafer does not move from the pedestal portion and does not contact the inner wall of the concave portion while rotating the turntable. In addition, the surface of the wafer placed on the pedestal portion may be higher or lower than the surface of the turntable.

With respect to a film deposition process performed by the film deposition apparatus described above, reaction products indicated in the left column in TABLE 1 may be deposited in addition to the silicon oxide film described above. In TABLE 1, on the right side of the reaction product column, examples of process gases used in each film deposition process are indicated. With respect to the gas species used in depositing the silicon oxide film, examples other than the gases described above are indicated.

TABLE 1

| Reaction Product | First Process Gas | Second Process Gas |
| --- | --- | --- |
| Titanium Nitride (TiN) Film | Titanium Chloride (TiCl$_4$) Film | Ammonia (NH$_3$) Gas |

TABLE 1-continued

| Reaction Product | First Process Gas | Second Process Gas |
| --- | --- | --- |
| High-k Film (Zirconium Oxide Film ZrO) | Tetrakis(ethylmethyl-amino)zirconium (TEMAZ) Gas | Ozone Gas |
| High-k Film (Aluminum Oxide Film $Al_2O_3$) | Trimethyl Aluminum (TMA) Gas | Ozone Gas |
| Silicon Nitride (SiN) Film | Dichlorosilane (DCS) Gas, Trichlorosilane ($SiHCl_3$) Gas | Ammonia Gas |
| Silicon Oxide Film | Diisopropylaminosilane (DIPAS) Gas | Ozone Gas |
| | Tris(dimethylamino)silane (3DMAS) Gas | Ozone Gas |

Accordingly, the plasma generation gas may be properly changed depending on a kind of reaction product.

In the above embodiments, the description has been given of the examples of a film deposition apparatus performing the plasma modification process in addition to the film deposition process. Thus, performing the plasma modification process is not necessary. In this case, components used in the modification process such as the plasma generator 80 and the like do not need to be provided.

In each of the embodiments, although the description has been given of the examples of providing the turntable 2 made of quartz, the turntable 2 may be made of carbon (C), silicon carbide (SiC), aluminum (Al) or the like. Moreover, although the description has been given of the examples of rotating the turntable 2 in a clockwise fashion when rotating the turntable 2 about the vertical axis, each of the processes described above may be performed by rotating the turntable 2 in a counterclockwise fashion.

WORKING EXAMPLES

<Evaluation Test>

Figure 25:
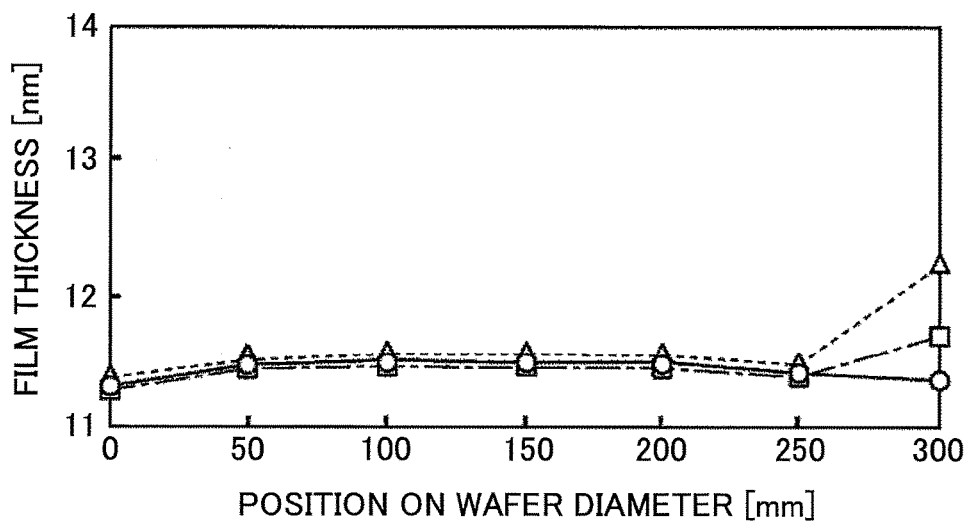
FIG. 25 is a characteristic chart showing a result of working example 1.

A film deposition process was performed on six monitor wafers 1 through 6 by using the film deposition apparatus illustrated in FIG. 1, and film thicknesses thereof were measured by using an ellipsometer. With respect to conditions of the film deposition process, a wafer temperature was set at 620 degrees C., and a process pressure was set at 1.26 kPa (9.5 Torr). Also, a rotational speed of the turntable 2 was set at 180 rpm (Working Example 1). A result of working example 1 is shown in FIG. 25. In the graph, the vertical axis indicates a film thickness, and the horizontal axis indicates a position on the wafer diameter. In the horizontal axis, 0 mm indicates a position on the center O1 side of the turntable 2, and 300 mm indicates a position on the peripheral side of the turntable 2. In this example, a notch N is formed at a position of 300 mm. Actually, the film thicknesses of six of the wafers were measured. In the graph, wafer 6 having had the most preferable uniformity of film thickness across the film is plotted by circular marks, and wafer 4 having has the worst uniformity of film thickness across the film is plotted with triangular mark. Wafer 5 having had the middle uniformity of film thickness across the film is plotted with square mark.

Figure 26:
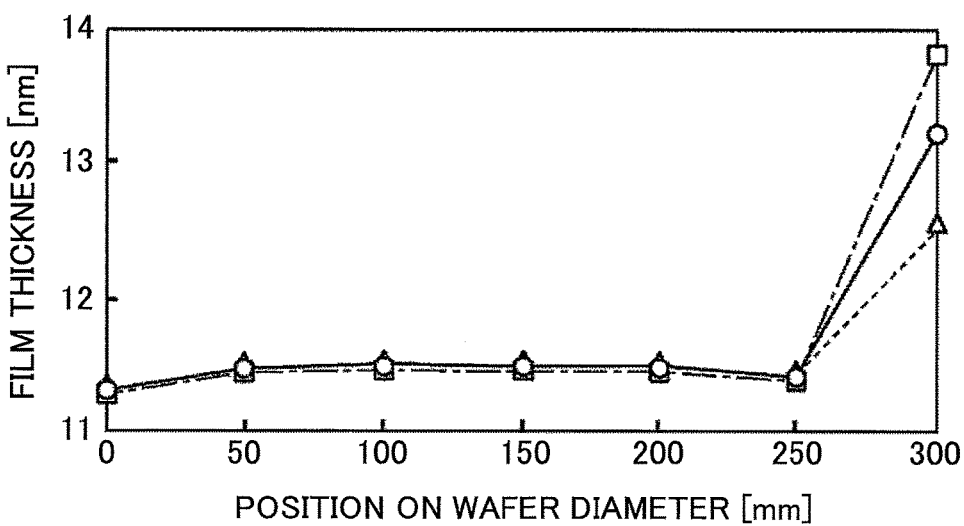
FIG. 26 is a characteristic chart showing a result of comparative example 1.

In comparative example 1, a film deposition process was performed on six monitor wafers under the same process conditions as working example 1 by using the film deposition apparatus illustrated in FIG. 1 except that the slits 271 through 275 forming the communication passage were not formed in the turntable 2, and the film thicknesses thereof were measured. A result of comparative example 1 is shown in FIG. 26. In the graph, the vertical axis indicates a film thickness, and the horizontal axis indicates a position on the wafer diameter. Wafers 6, 4 and 5 are plotted with circular marks, triangular marks and square marks, respectively, as well as working example 1. From FIGS. 25 and 26, it is acknowledged that the film thickness drastically increases at the position of 300 mm in the film deposition apparatus of comparative example 1 and that the film thickness of some wafers may increase at the position of 300 mm of working example 1 but an amount of increase is considerably smaller than that of comparative example 1. The results indicate that the uniformity of film thickness across the film can be improved by providing the communication passage for the concave portion 24 and discharging the gas in the concave portion 24 to the outside of the turntable 2.

<Evaluation Test 2>

Figure 27:
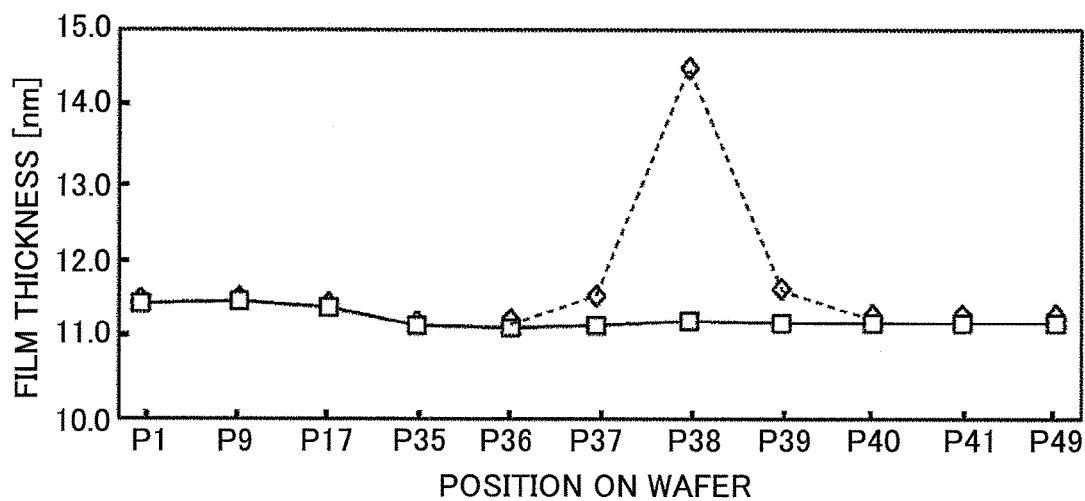
FIG. 27 is a characteristic chart showing a relationship between a film thickness and position in a wafer.

A film deposition process was performed on a monitor wafer under the same process conditions and by using the same film deposition apparatus as working example 1, and film thicknesses were measured with respect to 49 measurement points within a surface of the wafer (Working Example 2). The results are shown in FIG. 27 by plotting the film thicknesses by square marks. In the graph, the vertical axis indicates a film thickness, and the horizontal axis indicates a position on the wafer. Forty nine of the measurement points are distributed to a plurality of locations on the same concentric circle when a plurality of concentric circles with increasing its radius by 50 mm from the center of the wafer was drawn. A position P1 indicates the center of the wafer, and a position P38 indicates a position closest to the outer circumference of the turntable 2, at which a notch N is formed. Similarly, film thicknesses were measured at the same measurement points when a film deposition process was performed on a monitor wafer under the same process conditions by using the same film deposition apparatus as comparative example 1 (Comparative Example 2). The results were plotted with rhombic marks in FIG. 27.

FIG. 27 indicates that the film thickness on the wafer W is substantially constant with respect to the wafer deposited by the film deposition apparatus including the communication passage, and that the film thickness does not increase even in the vicinity of the notch N. This result confirms that the preferable uniformity of film thickness across the film can be obtained while preventing the local increase of the film thickness by discharging the gas in the concave portion 24 to the outside of the turntable 2 through the communication passage.

<Evaluation Test 3>

The uniformity of film thickness across the film was measured with respect to six of the monitor wafers subject to the film deposition process under the same process conditions by using the same film deposition apparatus as working example 1 (Working Example 3). This uniformity of film thickness was obtained by measuring film thicknesses of 49 measurement points within the wafer surface as well as working example 2, and by using formula (1).

$$\{(\text{maximum film thickness} - \text{minimum film thickness})/(\text{average film thickness} \times 2)\} \times 100 \qquad (1)$$

Figure 28:
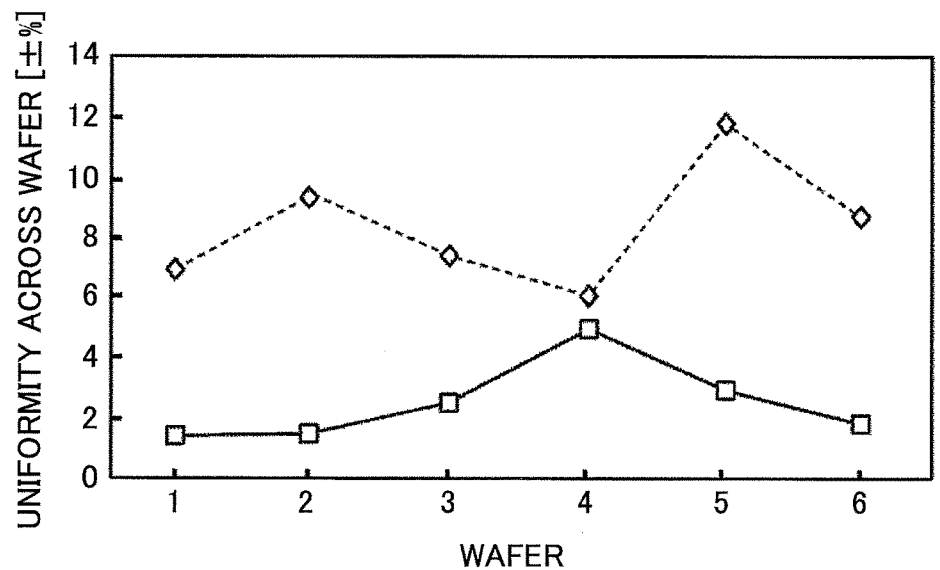
FIG. 28 is a characteristic chart showing uniformity of a film thickness across the film.

The result was shown in FIG. 28 plotted with square marks. In the graph, the vertical axis indicates the uniformity of film thickness, and the horizontal axis indicates six of the wafers, to which numerals 1 through 6 are attached. Similarly, the uniformity of film thickness was measured when a film deposition process was performed on six monitor wafers under the same process conditions by using the same film deposition apparatus as comparative example 1 (Comparative Example 3). The result was shown in FIG. 28 plotted with rhombic marks.

FIG. 28 indicates that the uniformity of film thickness of the wafer deposited by the film deposition apparatus including the communication passage significantly improves more than the wafers deposited by the film deposition apparatus without the communication passage.

<Evaluation Test 4>

Figure 29:
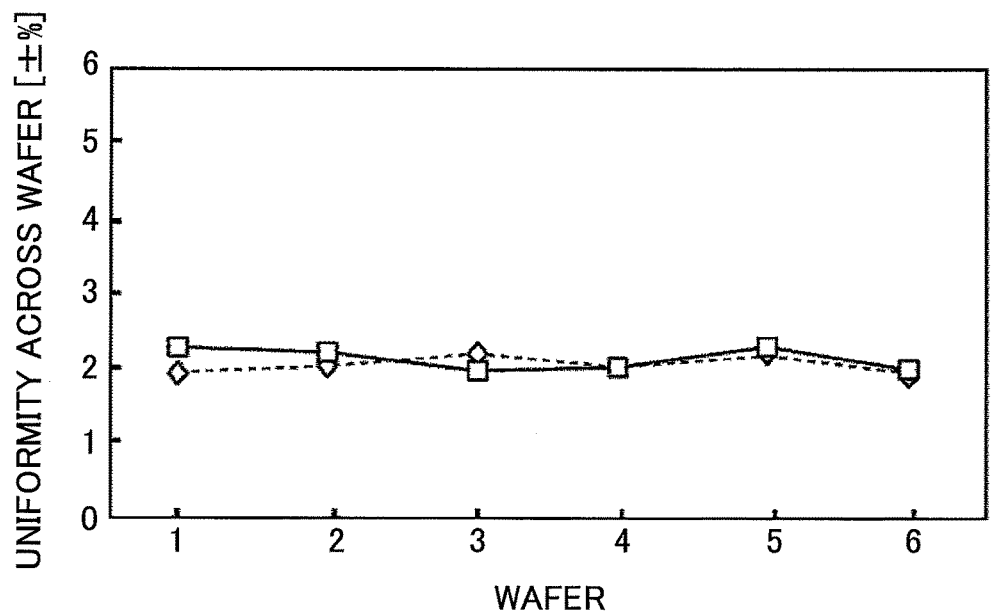
FIG. 29 is a characteristic chart showing uniformity of a film thickness across the film.

A film deposition process was performed on six monitor wafers by using the film deposition apparatus illustrated in FIG. 1 but by changing process conditions, and the uniformity of film thickness was measured as well as working example 3 (Working Example 4). With respect to the process conditions, a wafer temperature was set at 620 degrees C., and a process pressure was set at 0.89 kPa (6.7 Torr). Also, a rotational speed of the turntable 2 was set at 120 rpm. The result is shown in FIG. 29 plotted with square marks. In the graph, the vertical axis indicates uniformity of film thickness, and the horizontal axis indicates six of the wafers. Similarly, uniformity of film thickness was measured when a film deposition process was performed on six of the wafers under the same process conditions as working example 4 and by using the same film deposition apparatus as comparative example 1 (Comparative Example 4). The result is shown in FIG. 29 plotted with rhombic marks.

FIG. 29 indicates that the uniformity of film thickness is substantially the same as each other without respect to the presence or the absence of the communication passage when the process pressure is 0.89 kP1 and the rotational speed of the turntable 2 is 120 rpm. Accordingly, FIG. 29 confirms that the preferable uniformity of film thickness can be obtained without respect to the magnitude of the process pressure and the rotational speed of the turntable 2 according to the film deposition apparatus of the embodiments of the present invention. This indicates that feasible film deposition processes increase by using the film deposition apparatus of the embodiments of the present invention, and that the general versatility of the film deposition apparatus is high.

Furthermore, with respect to the film thickness of six of the monitor wafers subject to the film deposition process under the process conditions of each of working examples 3 and 4 and comparative examples 3 and 4, dispersion of the film thickness among the wafers was calculated by formula (1) by using an average value of the film thickness of each of the wafers. In formula (1), the maximum film thickness means the greatest film thickness among the average values of six of the wafers, and the minimum film thickness means the smallest film thickness among the average values of six of the wafers. The average film thickness means a film thickness obtained by calculating an average of the film thickness of six of the wafers (each of the average values).

Figure 30:
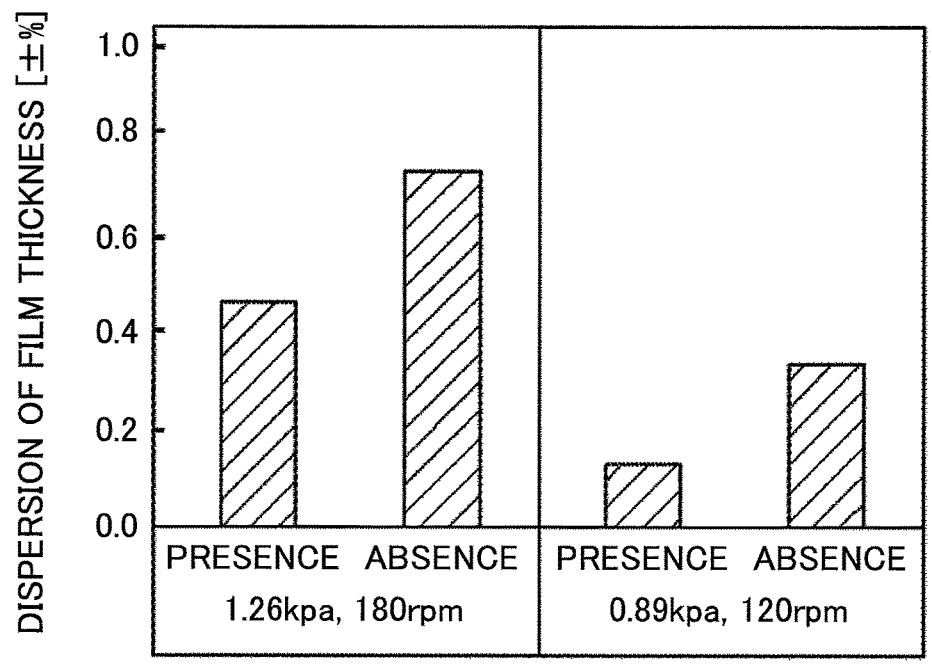
FIG. 30 is a characteristic chart showing uniformity of a film thickness across the film.

The result is illustrated in FIG. 30. In FIG. 30, the vertical axis indicates the dispersion of the film thickness. In FIG. 30, "presence" means the case of including the slit, and "absence" means the case of not including the slit. The process conditions are shown together. Hence, working example 3 corresponds to data of 1.26 kPa, 180 rpm and "presence", and comparative example 3 corresponds to data of 1.26 kPA, 180 rpm and "absence". Working example 4 corresponds to data of 0.89 kPa, 120 rpm and "absence", and comparative example 4 corresponds to data of 0.89 kPa, 120 rpm and "absence". This indicates that even under the different process conditions, by performing the film deposition process by using the film deposition apparatus including the slit (communication passage) formed therein, the dispersion of the film thickness decreases, and the uniformity of the film thickness across the film among the wafers can be improved.

In the film deposition apparatus according to the embodiments of the present invention, a pedestal portion for supporting a location closer to the central side than the peripheral side of a substrate is provided in a concave portion formed in a surface of a turntable, and a communication passage is formed in a wall portion of the concave portion so that a space around the pedestal portion in the concave portion is in communication with a space outside the turntable. Although a gas approaches the outer circumferential side of the turntable due to a centrifugal force caused by rotation of the turntable, the gas is discharged to the space outside the turntable through the communication passage. This prevents the gas in the concave portion from dispersing upward to an area above the turntable and the gas from being supplied to the substrate. This prevents an amount of gas supply from increasing to a specific part within the surface of the substrate and a location having a greater film thickness from being generated locally, thereby improving the uniformity of the film thickness across the surface of the substrate.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention.

What is claimed is:

1. A film deposition apparatus, comprising:
 a vacuum chamber;
 a turntable provided in the vacuum chamber;
 a concave portion formed in a surface of the turntable to accommodate a substrate therein, the concave portion having an inner wall surface that defines the concave portion;
 a pedestal portion to support a location inside a periphery of the substrate in the concave portion, the pedestal portion having a diameter smaller than a diameter of the substrate;
 at least one communication passage formed in a part of the inner wall surface of the concave portion, the at least one communication passage penetrating through the turntable from the inner wall surface of the concave portion to an outer surface of the turntable, the at least one communication passage extending parallel or perpendicularly to an upper surface of the turntable to cause a first space around the pedestal portion in the concave portion to be in communication with a second space outside the turntable and inside the vacuum chamber, the at least one communication passage being provided in an end area of the concave portion located opposite to a first center of the turntable when seen from a second center of the concave portion; and
 an exhaust opening to evacuate the vacuum chamber.

2. The film deposition apparatus as claimed in claim 1, wherein the concave portion has a circular planar shape.

3. The film deposition apparatus as claimed in claim 1, wherein the end area of the concave portion is an area between straight lines extending from the first center of the turntable to both sides in a radial direction by making an angle of 30 degrees with a center line connecting the first center of the turntable to the second center of the concave portion, respectively.

4. The film deposition apparatus as claimed in claim 1,
wherein the at least one communication passage is provided to discharge the gas approaching an outer circumferential side of the turntable in the concave portion due to a centrifugal force caused by rotation of the turntable, and the substrate contacts the side wall of the concave portion by approaching the outer circumferential side of the turntable due to the centrifugal force caused by the rotation of the turntable.

5. The film deposition apparatus as claimed in claim 1,
wherein the at least one communication passage is formed in a side wall of the concave portion, and the exhaust opening is provided outside an outer circumference of the turntable when seen in a planar view.

6. The film deposition apparatus as claimed in claim 1, further comprising:

a reaction gas supply area configured to supply a reaction gas to the substrate and provided above the turntable, wherein the exhaust opening is provided in a position where an exhaust flow heading for a downstream side in a rotational direction of the turntable in the reaction gas supply area, and the at least one communication passage is arranged on the upstream side of a center line connecting the first center of the turntable to the second center of the concave portion in the rotational direction of the turntable.

7. The film deposition apparatus as claimed in claim 1, wherein the at least one communication passage includes a plurality of slits formed in a side wall of the concave portion and arranged at intervals in a circumferential direction.

8. The film deposition apparatus as claimed in claim 1, further comprising:

a source gas supply area configured to supply a source gas to the substrate and provided above the turntable;

a reaction gas supply area configured to supply a reaction gas reactable with the source gas to the substrate and provided above the turntable and apart from the source gas supply area in a rotational direction of the turntable, wherein the substrate on the turntable alternately passes the source gas supply area and the reaction gas supply area by a rotation of the turntable.

9. A film deposition apparatus, comprising:
a vacuum chamber;
a turntable provided in the vacuum chamber;
a concave portion formed in a surface of the turntable to accommodate a substrate therein;
a pedestal portion to support a location inside a periphery of the substrate in the concave portion, the pedestal portion having a diameter smaller than a diameter of the substrate;
at least one communication passage formed in a wall portion of the concave portion, the at least one communication passage extending parallel or perpendicularly to an upper surface of the turntable to cause a first space around the pedestal portion in the concave portion to be in communication with a second space outside the turntable and inside the vacuum chamber, the at least one communication passage being provided in an end area of the concave portion located opposite to a first center of the turntable when seen from a second center of the concave portion; and
an exhaust opening to evacuate the vacuum chamber.

10. A film deposition apparatus, comprising:
a vacuum chamber;
a turntable provided in the vacuum chamber;
a concave portion formed in a surface of the turntable to accommodate a substrate therein, the concave portion having an inner wall surface that defines the concave portion;
a pedestal portion to support a location inside a periphery of the substrate in the concave portion, the pedestal portion having a diameter smaller than a diameter of the substrate;
at least one communication passage formed in a side wall surface of the inner wall surface of the concave portion, the at least one communication passage penetrating through the turntable from the side wall surface of the concave portion to an outer side surface of the turntable to cause a first space around the pedestal portion in the concave portion to be in communication with a second space outside the turntable and inside the vacuum chamber, the at least one communication passage being provided in an end area of the concave portion located opposite to a first center of the turntable when seen from a second center of the concave portion; and
an exhaust opening to evacuate the vacuum chamber.

\* \* \* \* \*